(12) United States Patent
Lee et al.

(10) Patent No.: US 11,974,449 B2
(45) Date of Patent: Apr. 30, 2024

(54) TANDEM ORGANIC LIGHT EMITTING ELEMENT AND DISPLAY DEVICE INCLUDING THE SAME

(71) Applicant: Samsung Display Co., Ltd., Yongin-si (KR)

(72) Inventors: Seokjae Lee, Seongnam-si (KR); Yunjae Kim, Suwon-si (KR); Jungkyun Kim, Gunpo-si (KR); Hyungu Kim, Yongin-si (KR); Bohun Park, Cheonan-si (KR); Jin Woo Park, Yongin-si (KR); Jungjin Yang, Seoul (KR); Bum Suk Lee, Hwaseong-si (KR); Sunhye Lee, Hwaseong-si (KR); Jaejin Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 41 days.

(21) Appl. No.: 17/374,517

(22) Filed: Jul. 13, 2021

(65) Prior Publication Data
US 2022/0149312 A1    May 12, 2022

(30) Foreign Application Priority Data
Nov. 10, 2020    (KR) .................. 10-2020-0149632

(51) Int. Cl.
*H10K 50/19*    (2023.01)
*H10K 50/13*    (2023.01)
(Continued)

(52) U.S. Cl.
CPC ......... *H10K 50/805* (2023.02); *H10K 50/131* (2023.02); *H10K 50/15* (2023.02);
(Continued)

(58) Field of Classification Search
CPC ............ H01L 27/3211; H01L 27/3216; H01L 51/504; H01L 51/5044; H01L 51/5278; H01L 27/3209
See application file for complete search history.

(56) References Cited

U.S. PATENT DOCUMENTS 8,581,270 B2    11/2013    Park et al.
9,293,732 B2    3/2016    Pyo et al.
(Continued)

FOREIGN PATENT DOCUMENTS

KR          10-1137392       4/2012
KR       10-2017-0026012     3/2017
(Continued)

*Primary Examiner* — Daniel Whalen
(74) *Attorney, Agent, or Firm* — KILE PARK REED & HOUTTEMAN PLLC

(57) ABSTRACT

A light-emitting element may include a first electrode, a second electrode facing the first electrode, a first hole transport layer disposed above the first electrode, a first electron transport layer disposed between the first hole transport layer and the second electrode. A first light-emitting part and a second light-emitting part that emit different light may be disposed between the first hole transport layer and the first electron transport layer. The first light-emitting part may include a first blue emission layer, a second electron transport layer, a charge generation layer, and a second blue emission layer, and the first blue emission layer may be disposed above the first hole transport layer. At least one of the first electron transport layer and the second electron transport layer may be directly disposed above at least one of the first blue emission layer and the second blue emission layer.

21 Claims, 9 Drawing Sheets

(51) Int. Cl.
*H10K 50/15* (2023.01)
*H10K 50/16* (2023.01)
*H10K 50/17* (2023.01)
*H10K 50/805* (2023.01)
*H10K 102/00* (2023.01)

(52) U.S. Cl.
CPC ........... *H10K 50/16* (2023.02); *H10K 50/171* (2023.02); *H10K 50/19* (2023.02); *H10K 2102/351* (2023.02)

(56) References Cited

U.S. PATENT DOCUMENTS

| | | | |
|---|---|---|---|
| 9,859,518 B2 | 1/2018 | Park et al. | |
| 10,903,442 B2 | 1/2021 | Lee et al. | |
| 2005/0242712 A1* | 11/2005 | Sung | H10K 59/35 313/506 |
| 2015/0137082 A1* | 5/2015 | Kim | H01L 51/5265 257/40 |
| 2015/0155519 A1* | 6/2015 | Lee | H01L 27/3211 257/40 |
| 2020/0227687 A1* | 7/2020 | Ge | H10K 50/13 |
| 2022/0123061 A1* | 4/2022 | Lee | H10K 50/852 |
| 2022/0140015 A1* | 5/2022 | Kim | H10K 50/19 257/40 |

FOREIGN PATENT DOCUMENTS

| | | |
|---|---|---|
| KR | 10-2019-0055281 | 5/2019 |
| KR | 10-2047279 | 11/2019 |

\* cited by examiner

TANDEM ORGANIC LIGHT EMITTING ELEMENT AND DISPLAY DEVICE INCLUDING THE SAME

CROSS-REFERENCE TO RELATED APPLICATION(S)

This U.S. non-provisional patent application claims priority to and benefits of Korean Patent Application No. 10-2020-0149632 under 35 U.S.C. § 119, filed on Nov. 10, 2020 in the Korean Intellectual Property Office, the entire contents of which are hereby incorporated by reference.

BACKGROUND

1. Technical Field

The disclosure relates to a light-emitting element having multiple emission layers stacked thereon and a display device including the same.

2. Discussion of the Related Art

An organic light-emitting element may be a light-emitting element having an emission layer made of an organic material between an anode electrode and a cathode electrode. Holes provided from the anode electrode and electrons provided from the cathode electrode are combined in the emission layer to form excitons, and the excitons fall from the excited state to the ground state to emit light.

A tandem organic light-emitting element has, between an anode electrode and a cathode electrode, a structure in which multiple stacks, for example, two or more stacks, each having a hole transport layer, an emission layer, and an electron transport layer are formed, and a charge generation layer for assisting in generation and transfer charges exists between respective stacks.

A buffer layer may be disposed between the emission layer and the electron transport layer, and the buffer layer may prevent holes from being moved from the emission layer to another layer, and help electrons to move from the electron transport layer to the emission layer.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light-emitting element that may feature improved efficiency and life span.

The disclosure also provides a display device that may feature the light-emitting element with improved efficiency and life span.

An embodiment provides a light-emitting element that may include a first electrode, a second electrode facing the first electrode, a first hole transport layer disposed above the first electrode, a first electron transport layer disposed between the first hole transport layer and the second electrode, and a first light-emitting part and a second light-emitting part which may be disposed between the first hole transport layer and the first electron transport layer, the first light-emitting part and the second light-emitting part being spaced apart from each other, wherein the first light-emitting part may include a first blue emission layer disposed above the first hole transport layer, a second blue emission layer disposed above the first blue emission layer, a charge generation layer disposed between the first blue emission layer and the second blue emission layer, and a second electron transport layer disposed between the first blue emission layer and the charge generation layer, the second light-emitting part may include a second emission layer that emits red light or green light, and at least one of the first electron transport layer and the second electron transport layer may be directly disposed above at least one of the first blue emission layer and the second blue emission layer.

In an embodiment, the second electron transport layer may be directly disposed above the first blue emission layer.

In an embodiment, a buffer layer directly disposed between the first electron transport layer and the second blue emission layer may be further included.

In an embodiment, a thickness of the buffer layer may be about 100 Å or less.

In an embodiment, the first electron transport layer may be directly disposed above the second emission layer.

In an embodiment, at least one of the first electron transport layer and the second electron transport layer may have a thickness of about 100 Å to about 300 Å.

In an embodiment, a material included in the first electron transport layer and a material included in the second electron transport layer may be different from each other.

In an embodiment, a third light-emitting part including a third emission layer that emits red light or green light may be further included, and the third emission layer and the second emission layer may emit light of different wavelength regions.

In an embodiment, each of the first blue emission layer and the second blue emission layer may include a dopant and a host, and the dopant of the first blue emission layer and the dopant of the second blue emission layer may be different from each other.

In an embodiment, the host of the first blue emission layer and the host of the second blue emission layer may be different from each other.

In an embodiment, a content of the dopant in the first blue emission layer and a content of the dopant in the second blue emission layer may be different from each other.

In an embodiment, a first blue light-emitting auxiliary layer disposed below the first blue emission layer, a second blue light-emitting auxiliary layer disposed below the second blue emission layer, and a second light-emitting auxiliary layer disposed below the second emission layer may be further included.

In an embodiment, a hole injection layer disposed above the first electrode may be further included.

In an embodiment, an electron injection layer disposed below the second electrode may be further included.

In an embodiment, a capping layer disposed above the second electrode and having a refractive index of about 1.6 or more may be further included.

In an embodiment, a light-emitting element may include a first electrode, a second electrode facing the first electrode, a first hole transport layer disposed above the first electrode, a first electron transport layer disposed between the first hole transport layer and the second electrode, and a first light-emitting part and a second light-emitting part which may be spaced apart from each other and disposed between the first hole transport layer and the first electron transport layer, the first light-emitting part emitting first light and the second light-emitting part emitting second light that may be different from the first light, wherein the first light-emitting part may include a first blue emission layer disposed above the first hole transport layer, a second blue emission layer disposed above the first blue emission layer, a charge generation layer disposed between the first blue emission layer and the second blue emission layer, and a second electron transport layer disposed between the first blue emission layer and the charge generation layer, the second light-emitting part may include a second emission layer that emits the second light, the straight-line distance from the first electrode to the first blue emission layer may be equal to a second resonance distance of the first light, the straight-line distance from the first electrode to the second emission layer may be equal to a second resonance distance of the second light, and the straight-line distance from the first electrode to the second blue emission layer may be equal to a third resonance distance of the first light.

In an embodiment, at least one of the first electron transport layer and the second electron transport layer may be directly disposed above at least one of the first blue emission layer and the second blue emission layer.

In an embodiment, the second light may be red light or green light.

In an embodiment, a third light-emitting part including a third emission layer that emits a third light that may be different from the first light and the second light may be further included, wherein the straight-line distance from the first electrode to the third emission layer may be equal to a second resonance distance of the third light.

In an embodiment, a display device may comprise a blue light-emitting region, a red light-emitting region, and a green light-emitting region which may be spaced apart from each other, a base layer, a display element layer disposed on the base layer and including a light-emitting element, wherein the light-emitting element may include a first electrode, a second electrode facing the first electrode, a first hole transport layer disposed above the first electrode, a first electron transport layer disposed between the first hole transport layer and the second electrode, a first light-emitting part and a second light-emitting part which may be disposed between the first hole transport layer and the first electron transport layer, and spaced apart from each other, and a capping layer disposed above the second electrode and having a refractive index of about 1.6 or more, wherein the first light-emitting part may include a first blue emission layer disposed above the first hole transport layer, a second blue emission layer disposed above the first blue emission layer, a charge generation layer disposed between the first blue emission layer and the second blue emission layer, and a second electron transport layer disposed between the first blue emission layer and the charge generation layer, the second light-emitting part may include a second emission layer that emits red light or green light, and at least one of the first electron transport layer and the second electron transport layer may be directly disposed above at least one of the first blue emission layer and the second blue emission layer.

BRIEF DESCRIPTION OF THE FIGURES

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
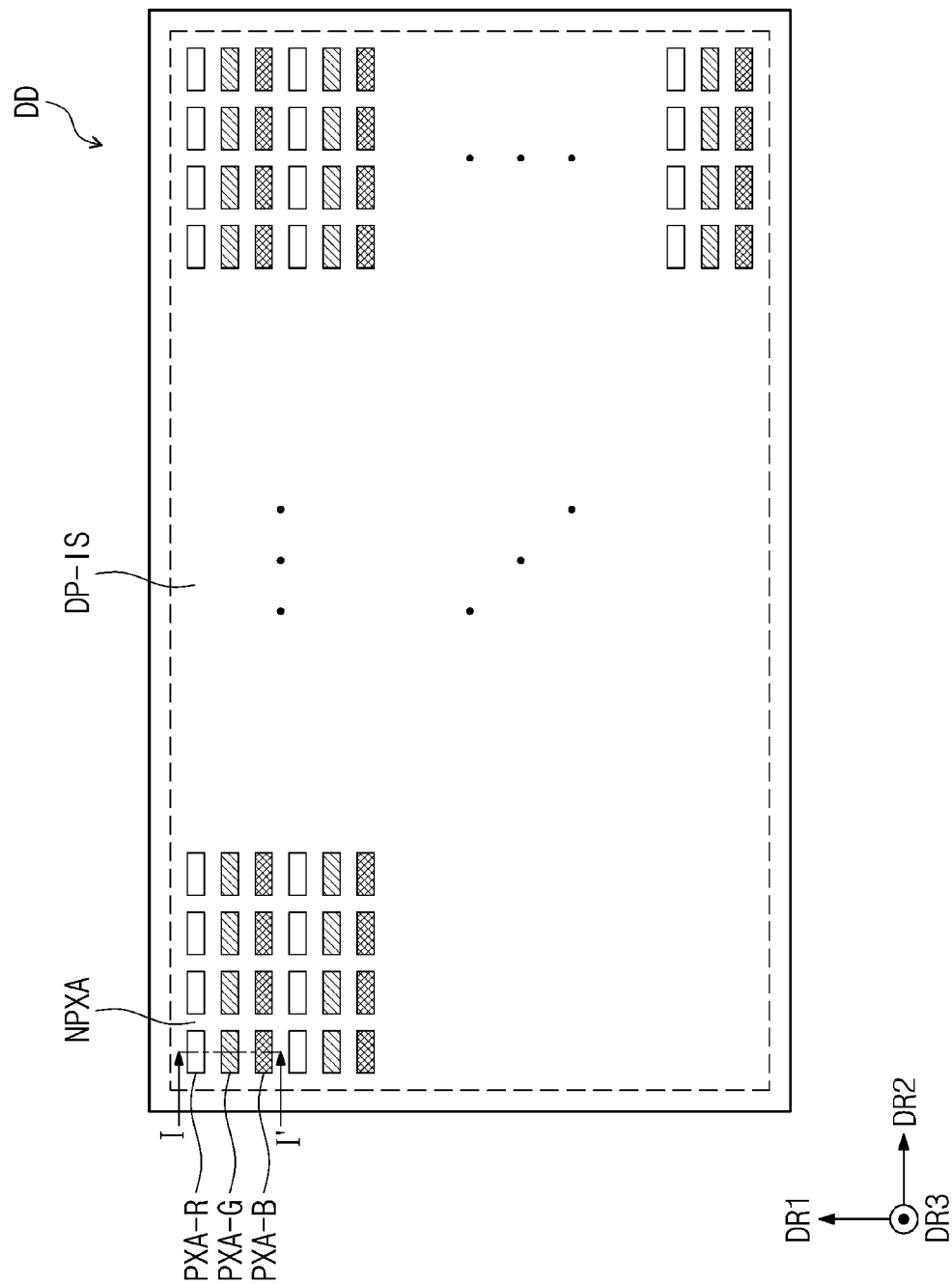
FIG. 1 is a plan view schematically illustrates a display device according to an embodiment.

Embodiments of the disclosure are susceptible to various modifications and alternative forms, and specific embodiments thereof are illustrated by way of example in the drawings and will be described herein in detail. However, it should be understood that the disclosure is not intended to be limited by the specific forms disclosed, and all modifications, equivalents, and alternatives are included within the spirit and scope of the disclosure.

It will be understood that when an element (or region, layer, part, etc.) is referred to as being "on", "connected to", or "coupled to" another element, it can be directly on, connected or coupled to the other element or intervening elements may be present.

Like reference numerals refer to like elements throughout this specification. In the figures, thicknesses, ratios, and dimensions of components may be exaggerated for effective description of the technical contents.

The term "and/or" includes any and all of one or more combinations which may be defined by associated components. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc. may be used herein to describe various components, these components should not be limited by these terms. These terms are only used to distinguish one component from another component. For example, a first component may be termed a second component without departing from the scope of the disclosure, and similarly, a second component may be termed a first component. The singular forms, "a", "an" and "the" are intended to include the plural forms as well (and vice versa), unless the context clearly indicates otherwise.

Spatially relative terms, such as "below", "lower", "on", "upper" and the like are used herein to describe one component or feature's relationship to another component illustrated in the figures. The terms may be the spatially relative descriptors and described based on the direction shown in the drawings, and may be altered. For example, an upper layer may become a lower layer if a device is turned over.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprise", "include", and "have" etc., when used in this specification, specify the presence of stated features, integers, steps, operations, components, or parts, but do not preclude the presence or addition of one or more other features, integers, steps, operations, components, parts, or combination thereof.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a light-emitting element according to an embodiment and a display device including the same will be explained in detail with reference to the accompanying drawings.

Figure 2:
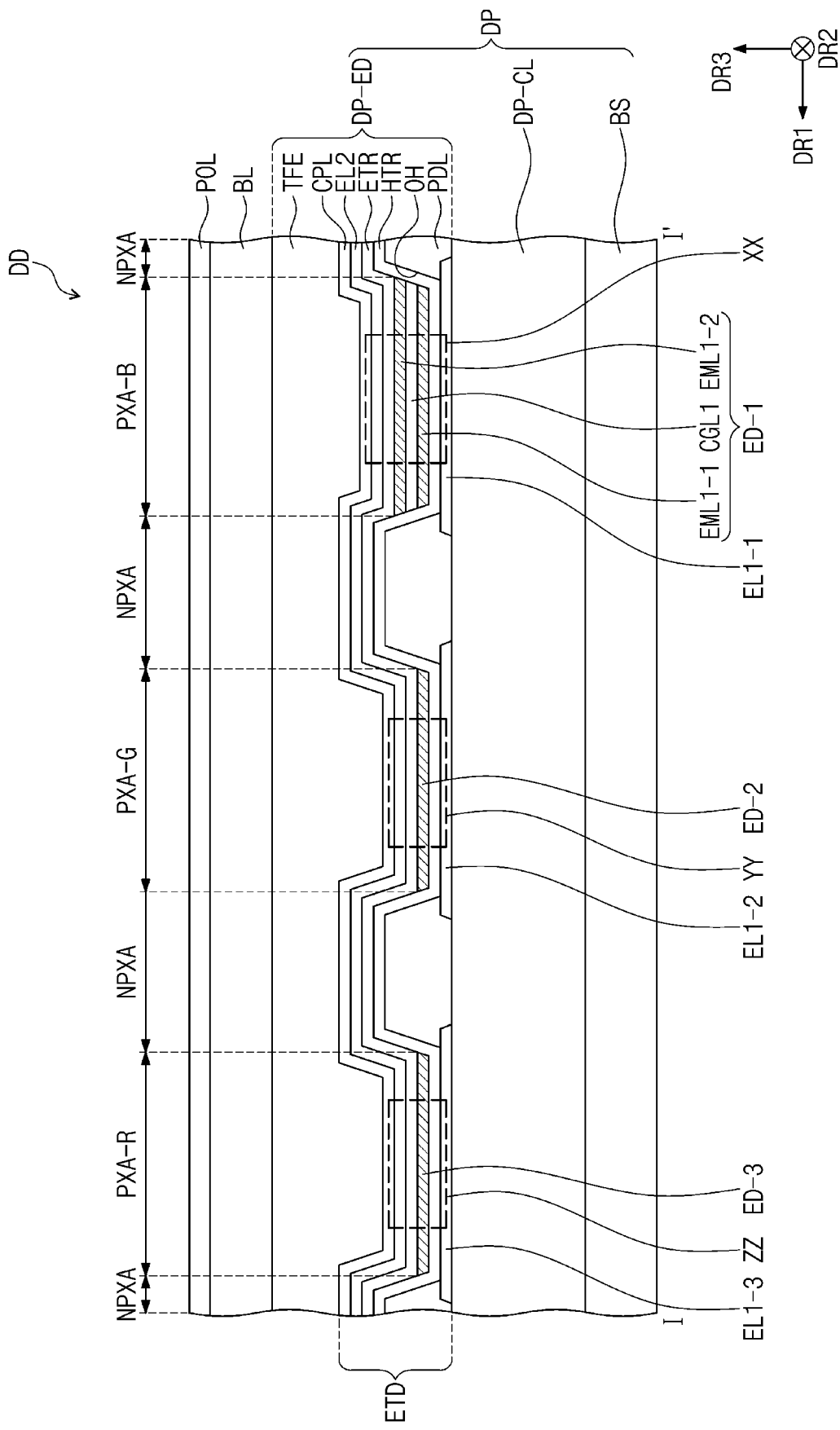
FIG. 2 is a cross-sectional view schematically illustrating a portion taken along line I-I' in FIG. 1.

FIG. 1 is a plan view schematically illustrating a display device DD according to an embodiment. FIG. 2 is a cross-sectional view schematically illustrating a portion taken along line I-I' in FIG. 1.

Referring to FIG. 1, a display device DD may display an image through a display surface DP-IS. The display surface DP-IS may be parallel to the plane defined by a first direction axis DR1 and a second direction axis DR2. A third direction axis DR3 may be perpendicular to the plane defined by the first direction axis DR1 and the second direction axis DR2. The third direction axis DR3 may be parallel to a thickness direction of the display device DD.

The display device DD may include a non-light emitting region NPXA and light-emitting regions PXA-R, PXA-G, and PXA-B. The light-emitting regions PXA-R, PXA-G, and PXA-B may be spaced apart from each other on a plane. Each of the light-emitting regions PXA-R, PXA-G, and PXA-B may emit different color light. The display device DD may include a red light-emitting region PXA-R, a green light-emitting region PXA-G, and a blue light-emitting region PXA-B. The light-emitting regions PXA-R, PXA-G, and PXA-B may be regions in which light generated from light-emitting parts ED-1, ED-2, and ED-3 (see FIG. 2) may be emitted, respectively. The light-emitting parts ED-1, ED-2, and ED-3 will be described in more detail later.

FIGS. 1 and 2 illustrate that all the light-emitting regions PXA-R, PXA-G, and PXA-B have similar areas, but embodiments are not limited thereto. The areas of the light-emitting regions PXA-R, PXA-G, and PXA-B may be different from each other depending on the wavelength region of the emitted light. The areas of the light-emitting regions PXA-R, PXA-G, and PXA-B may indicate areas as viewed on a plane defined by the first direction axis DR1 and the second direction axis DR2.

The arrangement of the light-emitting regions PXA-R, PXA-G, and PXA-B is not limited to the configuration illustrated in FIG. 1, and the arrangement order of the red light-emitting region PXA-R, the green light-emitting region PXA-G, and the blue light-emitting region PXA-B may be provided in various combinations depending on the properties of display quality required for the display device DD. For example, the light-emitting regions PXA-R, PXA-G, and PXA-B may be arranged in a PenTile® configuration or a diamond configuration.

The areas of the light-emitting regions PXA-R, PXA-G, and PXA-B may be different from each other. For example, in an embodiment, the area of the green light-emitting region PXA-G may be smaller than the area of the blue light-emitting region PXA-B, but embodiments are not limited thereto.

Referring to FIG. 2, a display device DD may include a base layer BS and a display element layer DP-ED disposed on the base layer BS. The display element layer DP-ED may include a light-emitting element ETD according to an embodiment. The light-emitting element ETD may include first electrodes EL1-1, EL1-2, and EL1-3, a second electrode EL2 facing the first electrodes EL1-1, EL1-2, and EL1-3, a hole transport region HTR and an electron transport region ETR disposed between the first electrodes EL1-1, EL1-2, and EL1-3 and the second electrode EL2. The hole transport region HTR may be disposed above the first electrodes EL1-1, EL1-2, and EL1-3, and the electron transport region ETR may be disposed between the hole transport region HTR and the second electrode EL2. The light-emitting element ETD may include multiple light-emitting parts ED-1, ED-2, and ED-3 disposed between the hole transport region HTR and the electron transport region ETR.

The light-emitting element ETD may include the first light-emitting part ED-1, the second light-emitting part ED-2, and the third light-emitting part ED-3 which may be spaced apart from each other on a plane. Each of the light-emitting parts ED-1, ED-2, and ED-3 may emit different light from each other. The first light-emitting part ED-1 may emit blue light, the second light-emitting part ED-2 may emit green light, and the third light-emitting part ED-3 may emit red light. The first light-emitting part ED-1 may correspond to a blue light-emitting region PXA-B, the second light-emitting part ED-2 may correspond to a green light-emitting region PXA-G, and the third light-emitting part ED-3 may correspond to a red light-emitting region PXA-R.

According to an embodiment, the first light-emitting part ED-1 may include a first blue emission layer EML1-1, a second blue emission layer EML1-2 disposed above the first blue emission layer EML1-1, and a first charge generation layer CGL1 disposed between the first blue emission layer EML1-1 and the second blue emission layer EML1-2. The second light-emitting part ED-2 may include a second emission layer EML2, and the third light-emitting part ED-3 may include a third emission layer EML3. FIG. 2 illustrates that the second light-emitting part ED-2 and the third light-emitting part ED-3 each includes one emission layer, but embodiments are not limited thereto. At least one of the second light-emitting part ED-2 and the third light-emitting part ED-3 may include multiple emission layers. The first light-emitting part ED-1 may include at least three emission layers.

Figure 3:
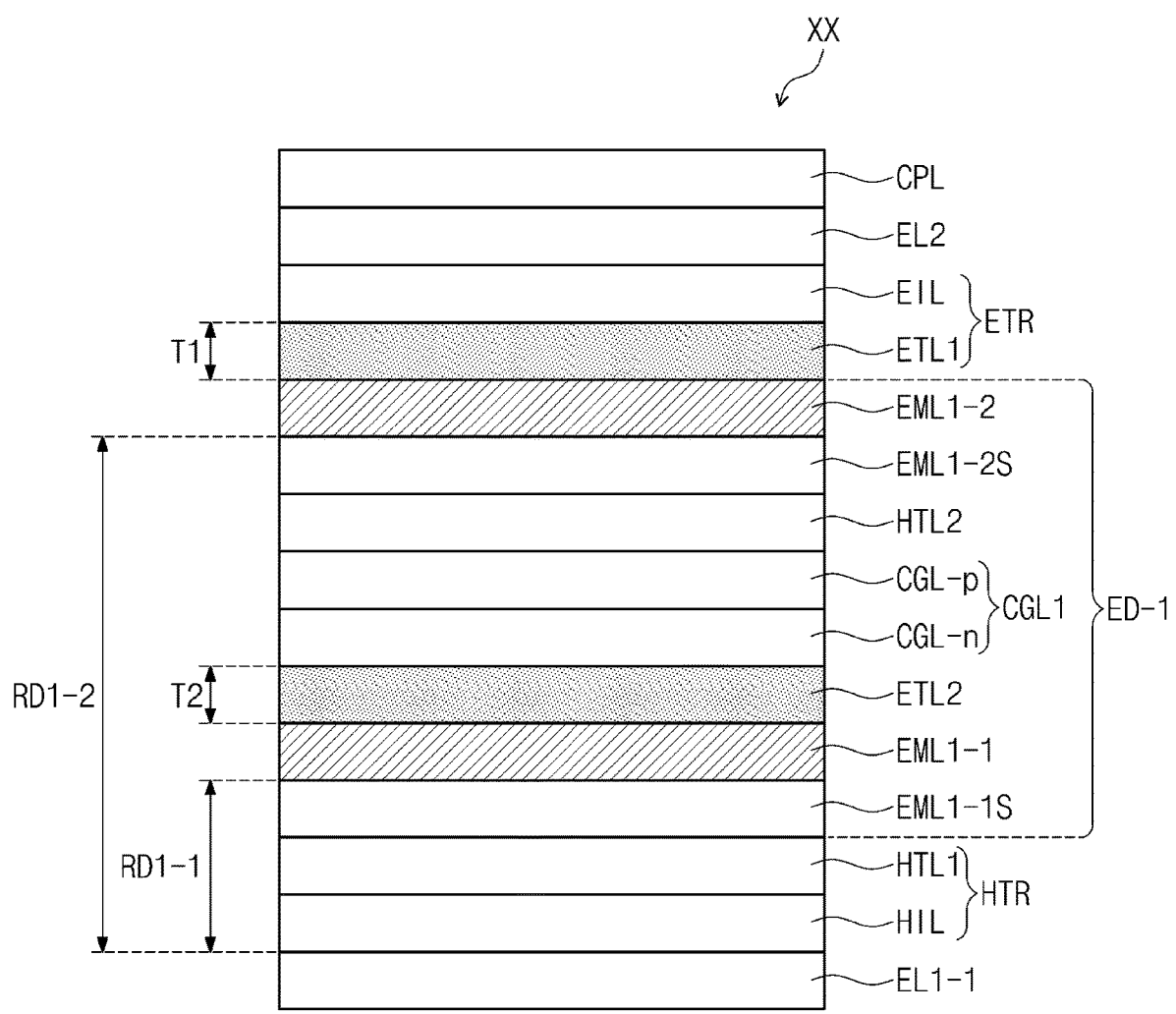
FIG. 3 is a cross-sectional view schematically illustrating a portion corresponding to region XX in FIG. 2.
Figure 4:
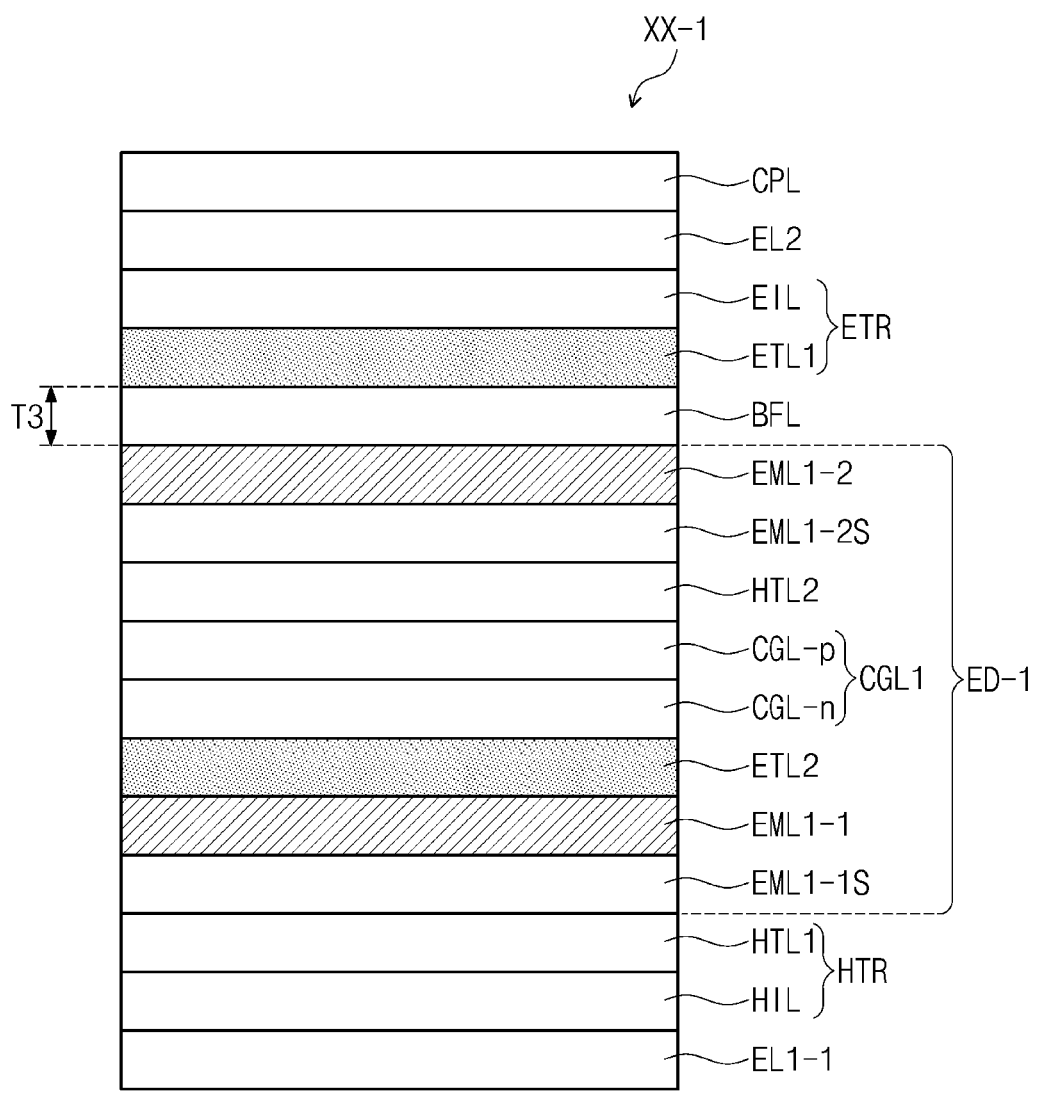
FIG. 4 is a cross-sectional view schematically illustrating a light-emitting element according to an embodiment.
Figure 5:
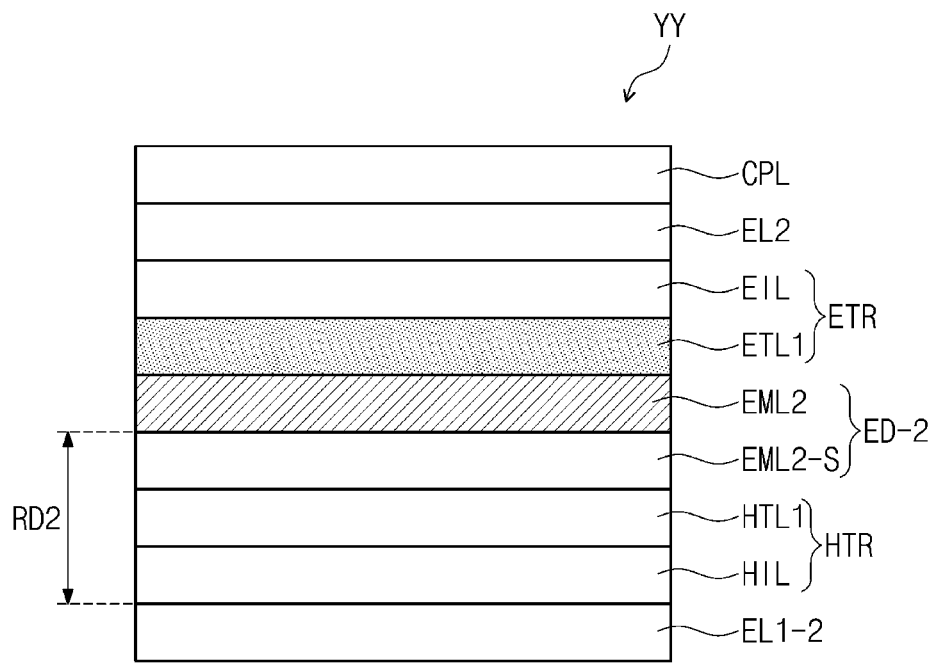
FIG. 5 is a cross-sectional view schematically illustrating a portion corresponding to region YY in FIG. 2.
Figure 6:
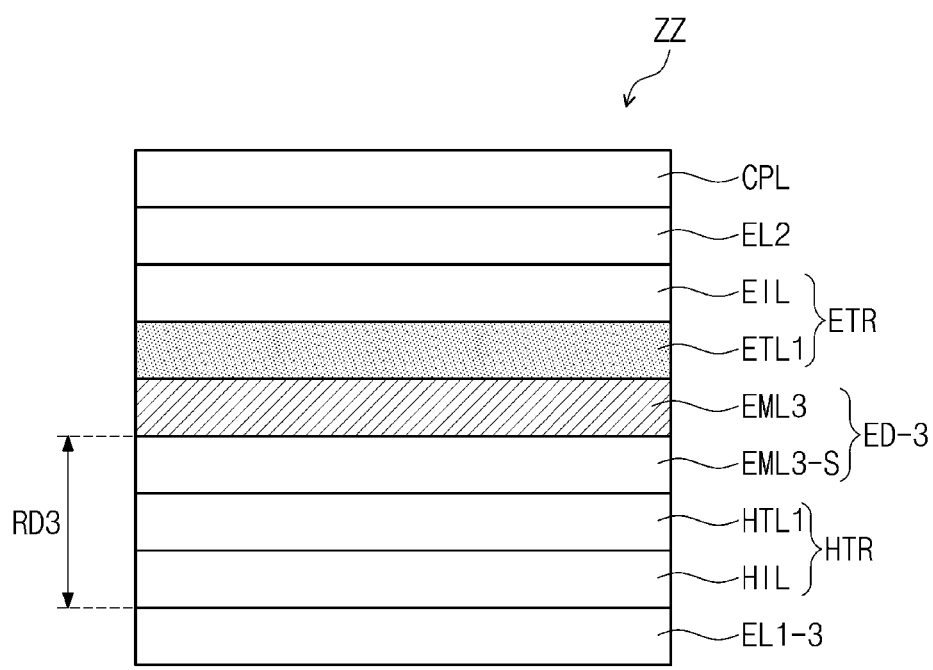
FIG. 6 is a cross-sectional view schematically illustrating a portion corresponding to region ZZ in FIG. 2.

FIG. 3 is a cross-sectional view schematically illustrating a portion corresponding to region XX in FIG. 2. FIG. 4 is a cross-sectional view schematically illustrating another embodiment corresponding to region XX in which a buffer layer BFL may be disposed below a first electron transport layer ETL1 unlike the configuration illustrated in FIG. 3. FIG. 5 is a cross-sectional view schematically illustrating a portion corresponding to region YY in FIG. 2. FIG. 6 is a cross-sectional view schematically illustrating a portion corresponding to region ZZ in FIG. 2.

Referring to FIG. 3, the hole transport region HTR may include a first hole transport layer HTL1, and the electron transport region ETR may include a first electron transport layer ETL1. The hole transport region HTR may include a hole injection layer HIL disposed between the first hole transport layer HTL1 and the first electrode EL1-1. The electron transport region ETR may include the electron injection layer EIL disposed between the second electrode EL2 and the first electron transport layer ETL1. Although not illustrated, the hole transport region HTR may further include an electron blocking layer. The electron blocking layer may be a layer that serves to prevent the movement of electrons from the emission layers EML1-1 and EML1-2 to the hole transport region HTR.

The first light-emitting part ED-1 may be disposed between the first hole transport layer HTL1 and the first electron transport layer ETL1. The first light-emitting part ED-1 may include the first blue emission layer EML1-1, the first charge generation layer CGL1, and the second blue emission layer EML1-2 which may be sequentially stacked. The first blue emission layer EML1-1 may be disposed above the first hole transport layer HTL1. A second electron transport layer ETL2 may be disposed between the first blue emission layer EML1-1 and the first charge generation layer CGL1. The first electron transport layer ETL1 may be disposed above the second blue emission layer EML1-2. A second hole transport layer HTL2 may be disposed between the first charge generation layer CGL1 and the second blue emission layer EML1-2.

According to an embodiment, at least one of the first electron transport layer ETL1 and the second electron transport layer ETL2 may be directly disposed above the second blue emission layer EML1-2 or the first blue emission layer EML1-1. Referring to FIG. 3, the second electron transport layer ETL2 may be directly disposed above the first blue emission layer EML1-1, and the first electron transport layer ETL1 may be directly disposed above the second blue emission layer EML1-2. Referring to FIG. 4, the second electron transport layer ETL2 may be directly disposed above the first blue emission layer EML1-1, and the first electron transport layer ETL1 may not be directly disposed above the second blue emission layer EML1-2. The buffer layer BFL may be disposed between the first electron transport layer ETL1 and the second blue emission layer EML1-2. For example, the second electron transport layer ETL2 may be directly disposed above the first blue emission layer EML1-1, and the buffer layer BFL may be directly disposed above the second blue emission layer EML1-2. A thickness T3 of the buffer layer BFL directly disposed above the second blue emission layer EML1-2 may be about 100 Å or less. If the thickness of the buffer layer exceeds about 100 Å, the movement of electrons toward the emission layer may not be easy.

In other embodiments, the second electron transport layer ETL2 may not be directly disposed above the first blue emission layer EML1-1, and the first electron transport layer ETL1 may be directly disposed above the second blue emission layer EML1-2. The buffer layer BFL may be disposed between the second electron transport layer ETL2 and the first blue emission layer EML1-1. For example, the buffer layer BFL may be directly disposed above the first blue emission layer EML1-1, and the first electron transport layer ETL1 may be directly disposed on the second blue emission layer EML1-2.

In a related-art light-emitting element having a tandem structure, the buffer layer may be disposed between the electron transport layer and the emission layer. The tandem structure may be a stacked structure of multiple emission layers configured to emit light of a same wavelength region. The buffer layer may prevent holes that have moved from the hole transport region to the emission layer from moving from the emission layer to the electron transport region. The buffer layer may help electrons to move from the electron transport region to the emission layer.

In an embodiment, each of the first electron transport layer ETL1 and/or the second electron transport layer ETL2 directly disposed above the second blue emission layer EML1-2 or the first blue emission layer EML1-1 may function as a buffer layer BFL. Accordingly, in a light-emitting element ETD including multiple emission layers EML1-1 and EML1-2 configured to emit light of a same wavelength region, the buffer layer between the electron transport layer and the emission layer may be excluded.

The second electron transport layer ETL2 directly disposed above the first blue emission layer EML1-1 may help electrons to move from the electron transport region ETR to the first blue emission layer EML1-1, and may prevent holes that have moved from the hole transport region HTR to the first blue emission layer EML1-1 from moving toward the top of the first blue emission layer EML1-1. The first electron transport layer ETL1 directly disposed above the second blue emission layer EML1-2 may help electrons provided from the electron injection layer EIL to move to the second blue emission layer EML1-2, and may prevent holes that have moved from the hole transport region HTR to the second blue emission layer EML1-2 from moving toward the top of the second blue emission layer EML1-2. Accordingly, the probability of combining electrons and holes in the first blue emission layer EML1-1 and/or the second blue emission layer EML1-2 may be increased, and the light-emitting element ETD may exhibit improved efficiency and life span. As the step of forming the buffer layer may be excluded from the manufacturing process of a light-emitting element ETD, the manufacturing cost of a display device DD may be reduced.

The first electron transport layer ETL1 and the second electron transport layer ETL2 may each independently have a thickness T1 and T2 of about 100 Å to about 300 Å. The second electron transport layer ETL2 directly disposed above the first blue emission layer EML1-1 may have a thickness T2 of about 100 Å to about 300 Å. The first electron transport layer ETL1 directly disposed above the second blue emission layer EML1-2 may have a thickness T1 of about 100 Å to about 300 Å. If the thickness of the electron transport layer directly disposed on the emission layers EML1-1 and EML1-2 may be less than about 100l, a number of holes may move from the emission layers EML1-1 and EML1-2 to the top of the emission layers EML1-1 and EML1-2, and thus the probability of combining holes and electrons may be decreased. If the thickness of the electron transport layer directly disposed on the emission layers EML1-1 and EML1-2 may be more than about 300 Å, electrons may not be easy to move from the electron injection layer EIL to the emission layers EML1-1 and EML1-2, and thus the probability of combining holes and electrons may be decreased. If the probability of combining hole and electrons decreases, efficiency of the light-emitting element may be reduced.

According to an embodiment, a material included in the first electron transport layer ETL1 and a material included in the second electron transport layer ETL2 may be different. The first electron transport layer ETL1 and the second electron transport layer ETL2 may each independently include a single material, or multiple different materials. For example, the first electron transport layer ETL1 may include a single material and the second electron transport layer ETL2 may include multiple different materials. The single material included in the first electron transport layer ETL1 and the multiple materials included in the second electron transport layer ETL2 may be different. The first electron transport layer ETL1 may include multiple different materials and the second electron transport layer ETL2 may include a single material. The multiple materials included in the first electron transport layer ETL1 and the single material included in the second electron transport layer ETL2 may be different.

The first electron transport layer ETL1 and the second electron transport layer ETL2 may include a single material respectively. The single material included in the first electron transport layer ETL1 and the single material included in the second electron transport layer ETL2 may be different. The first electron transport layer ETL1 and the second electron transport layer ETL2 may include multiple different materials respectively. The multiple materials included in the first electron transport layer ETL1 and the multiple materials included in the second electron transport layer ETL2 may be different.

In other embodiments, the first electron transport layer ETL1 and the second electron transport layer ETL2 may include multiple different materials respectively, and at least one of the multiple different materials included in the first electron transport layer ETL1 and at least one of the multiple different materials included in the second electron transport layer ETL2 may be the same. The first electron transport layer ETL1 and the second electron transport layer ETL2 may include a single material, and the single material included in the first electron transport layer ETL1 and the single material included in the second electron transport layer ETL2 may be the same. The first electron transport layer ETL1 may include multiple different materials, and the second electron transport layer ETL2 may include any one of the multiple different materials included in the first electron transport layer ETL1. The second electron transport layer ETL2 may include multiple different materials, and the first electron transport layer ETL1 may include any one of the multiple different materials included in the second electron transport layer ETL2.

For example, if at least one of the first electron transport layer ETL1 and the second electron transport layer ETL2 includes multiple different materials, the different materials may include an electron transport material and an electron injection material. The electron transport material may be a material capable of transporting electrons, and the electron injection material may be at least one of Liq, LiF, KI, NaCl, CsF, $Li_2O$, and BaO. If multiple different materials include an electron transport material and an electron injection material, the ratio of the electron transport material and the electron injection material in the electron transport layers ETL1 and ETL2 may be about 1:9 to about 9:1. If the first electron transport layer ETL1 includes an electron transport material and an electron injection material, the ratio of the electron transport material and the electron injection material in the first electron transport layer ETL1 may be about 1:9 to about 9:1. If the second electron transport layer ETL2 includes an electron transport material and an electron injection material, the ratio of the electron transport material and the electron injection material in the second electron transport layer ETL2 may be about 1:9 to about 9:1.

Multiple different materials may include two types of electron transport materials. If different materials include two types of electron transport materials, the ratio of the two types of electron transport materials in the electron transport layers ETL1 and ETL2 may be about 1:9 to about 9:1. If the first electron transport layer ETL1 includes two types of electron transport materials, the ratio of the two types of electron transport materials in the first electron transport layer ETL1 may be about 1:9 to about 9:1. If the second electron transport layer ETL2 includes two types of electron transport materials, the ratio of the two types of electron transport materials in the second electron transport layer ETL2 may be 1:9 to 9:1.

In other embodiments, the multiple different materials may include an electron transport material and an n-dopant. The n-dopant may be a material capable of forming electrons by being doped into the electron transport layers ETL1 and ELT2, and may be at least one of Li, $Cs_2CO_3$, and $Rb_2CO_3$. If different materials include an electron transport material and an n-dopant, the content of the n-dopant in the electron transport layers ETL1 and ETL2 may be about 50% or less. If the first electron transport layer ETL1 includes an electron transport material and an n-dopant, the content of the n-dopant in the first electron transport layer ETL1 may be about 50% or less. If the second electron transport layer ETL2 includes an electron transport material and an n-dopant, the content of the n-dopant in the second electron transport layer ETL2 may be about 50% or less. However, this is merely illustrative, and a material and a ratio of the material included in the electron transport layers ETL1 and ETL2 are not limited thereto.

The first charge generation layer CGL1 may be disposed between the first blue emission layer EML1-1 and the second blue emission layer EML1-2. In case that voltage is applied to the first charge generation layer CGL1, electrons and holes may be generated by forming a complex through an oxidation-reduction reaction. The first charge generation layer CGL1 may respectively provide the generated charges to the first blue emission layer EML1-1 and the second blue emission layer EML1-2 which may be adjacent to the first charge generation layer CGL1. The first charge generation layer CGL1 may serve to control a balance of charges between the first blue emission layer EML1-1 and the second blue emission layer EML1-2.

The first charge generation layer CGL1 may include a first sub-charge generation layer CGL-n and a second sub-charge generation layer CGL-p. The first sub-charge generation layer CGL-n may be an n-type charge generation layer disposed adjacent to the first blue emission layer EML1-1 to provide electrons to the first blue emission layer EML1-1. The second sub-charge generation layer CGL-p may be a p-type charge generation layer disposed adjacent to the second blue emission layer EML1-2 to provide holes to the second blue emission layer EML1-2. However, embodiments are not limited thereto, and at least one of the first sub-charge generation layer CGL-n and the second sub-charge generation layer CGL-p may be omitted. If the first light-emitting part ED-1 includes three or more emission layers, the first light-emitting part ED-1 may include the charge generation layers respectively disposed between the emission layers.

According to an embodiment, each of the first blue emission layer EML1-1 and the second blue emission layer EML1-2 may include a dopant and a host. The dopant included in the first blue emission layer EML1-1 and the dopant included in the second blue emission layer EML1-2 may be different. The host included in the first blue emission layer EML1-1 and the host included in the second blue emission layer EML1-2 may be different. The content of the dopant in the first blue emission layer EML1-1 and the content of the dopant in the second blue emission layer EML1-2 may be different. For example, a doping concentration in the first blue emission layer EML1-1 and a doping concentration in the second blue emission layer EML1-2 may be different. However, embodiments are not limited thereto, and the first blue emission layer EML1-1 and the second blue emission layer EML1-2 may include a same host. The first blue emission layer EML1-1 and the second blue emission layer EML1-2 may include a same dopant.

A first blue light-emitting auxiliary layer EML1-1S may be disposed below the first blue emission layer EML1-1, and a second blue light-emitting auxiliary layer EML1-2S may be disposed below the second blue emission layer EML1-2. Each of the first blue light-emitting auxiliary layer EML1-1S and the second blue light-emitting auxiliary layer EML1-2S may control a balance of hole charges to improve blue light-emitting efficiency. Unlike the configuration illustrated in FIGS. 3 and 4, at least one of the first blue light-emitting auxiliary layer EML1-1S and the second blue light-emitting auxiliary layer EML1-2S may be omitted.

In a light-emitting element ETD according to an embodiment, the first blue emission layer EML1-1 and the second blue emission layer EML1-2 may be respectively spaced apart from the first electrode EL1-1 by a distance. The straight-line distance RD1-1 from the first electrode EL1-1 to the first blue emission layer EML1-1 may be equal to a second resonance distance of blue light. Light generated from the first blue emission layer EML1-1 may be reflected from the first electrode EL1-1 and spaced apart by a second resonance distance. The straight-line distance RD1-2 from the first electrode EL1-1 to the second blue emission layer EML1-2 may be equal to a third resonance distance of blue light. Light generated from the second blue emission layer EML1-2 may be reflected from the first electrode EL1-1 and spaced apart by a third resonance distance.

Referring to FIGS. 5 and 6, the second light-emitting part ED-2 may include the second emission layer EML2, and the third light-emitting part ED-3 may include the third emission layer EML3. The second light-emitting part ED-2 may further include a second light-emitting auxiliary layer EML2-S, and the third light-emitting part ED-3 may further include a third light-emitting auxiliary layer EML3-S.

The straight-line distance RD2 from the second emission layer EML2 to the first electrode EL1-2 may be equal to a second resonance distance of a second light generated by the second emission layer EML2. The second light-emitting auxiliary layer EML2-S may adjust a resonance distance of light exited from the second emission layer EML2. The straight-line distance RD3 from the third emission layer EML3 to the first electrode EL1-3 may be equal to a second resonance distance of a third light generated by the third emission layer EML3. The third light-emitting auxiliary layer EML3-S may adjust a resonance distance of light exited from the third emission layer EML3. The second light-emitting auxiliary layer EML2-S and the third light-emitting auxiliary layer EML3-S may increase color purity of light. The second light may be green light, and the third light may be red light.

In a light-emitting element ETD according to an embodiment, at least one of the first electron transport layer ETL1 and the second electron transport layer ETL2 may be disposed above the first blue emission layer EML1-1 or the second blue emission layer EML1-2. The second electron transport layer ETL2 directly on (e.g., disposed on) the first blue emission layer EML1-1 and the first electron transport layer ETL1 directly disposed on the second blue emission layer EML1-2 may prevent holes from leaving the emission layers EML1-1 and EML1-2 and may help electrons move to the emission layers EML1-1 and EML1-2. Accordingly, the light-emitting element ETD according to an embodiment may exhibit improved efficiency and life span.

Referring again to FIG. 2, a display device DD may include a display panel DP, an optical layer POL disposed above the display panel DP. The optical layer POL may be disposed above the display panel DP to control the reflected light by external light on the display panel DP. The optical layer POL may include, for example, a polarization layer or a color filter layer. The optical layer POL may be omitted in the display device DD according to an embodiment.

The optical layer POL may be disposed above a substrate BL. The substrate BL may be a member providing a base surface on which the optical layer POL may be disposed. The substrate may be a glass substrate, a metal substrate, a plastic substrate, or the like, or a combination thereof. However, embodiments are not limited thereto, and the substrate BL may be an inorganic layer, an organic layer, or a composite material layer. Unlike the illustration, the substrate BL may be omitted.

The display device DD according to an embodiment may further include a charging layer (not shown). The charging layer (not shown) may be disposed between the light-emitting element ETD and the substrate BL. The charging layer (not shown) may be an organic material layer. The charging layer (not shown) may include at least one of acrylic resins, silicon resins, and epoxy resins.

The display panel DP may include a base layer BS, a circuit layer DP-CL, and the display element layer DP-ED which may be sequentially stacked. As described above, the display element layer DP-ED may include a light-emitting element ETD according to an embodiment. The base layer BS may be a member configured to provide a base surface on which the display element layer DP-ED may be disposed. The base layer BS may be a glass substrate, a metal substrate, a plastic substrate, or the like, or a combination thereof. However, embodiments are not limited thereto, and the base layer BS may be an inorganic layer, an organic layer, or a composite material layer.

The circuit layer DP-CL may be disposed above the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light-emitting element ETD.

A light-emitting element ETD according to an embodiment may include first electrodes EL1-1, EL1-2, and EL1-3, a hole transport region HTR disposed above the first electrodes EL1-1, EL1-2, and EL1-3, an electron transport region ETR disposed above the hole transport region HTR, and a second electrode EL2 disposed above the electron transport region ETR. The light-emitting parts ED-1, ED-2, and ED-3 may be disposed between the hole transport region HTR and the electron transport region ETR.

The first electrodes EL1-1, EL1-2, and EL1-3 may have conductivity. The first electrodes EL1-1, EL1-2, and EL1-3 may be formed using a metal material, a metal alloy, a conductive compound, or a combination thereof. The first electrodes EL1-1, EL1-2, and EL1-3 may be an anode or a cathode. However, embodiments are not limited thereto. The first electrodes EL1-1, EL1-2, and EL1-3 may be a pixel electrode. The first electrodes EL1-1, EL1-2, and EL1-3 may be a transmissive electrode, a transflective electrode or a reflective electrode. If the first electrodes EL1-1, EL1-2, and EL1-3 are transmissive electrodes, the first electrodes EL1-1, EL1-2, and EL1-3 may include transparent metal oxide such as indium tin oxide (ITO), indium zinc oxide (IZO), zinc oxide (ZnO), indium tin zinc oxide (ITZO), or the like. If the first electrodes EL1-1, EL1-2, and EL1-3 are transflective electrodes or reflective electrodes, the first electrodes EL1-1, EL1-2, and EL1-3 may include Ag, Mg, Cu, Al, Pt, Pd, Au, Ni, Nd, Ir, Cr, Li, Ca, LiF/Ca, LiF/Al, Mo, Ti, W, or a compound or a mixture thereof (for example, a mixture of Ag and Mg). The first electrodes EL1-1, EL1-2, EL1-3 may have a multilayered structure including a reflective film or a transflective film formed using the above-described materials and a transparent conductive film formed using indium tin oxide (ITO), indium zinc oxide (IZO), zinc oxide (ZnO), indium tin zinc oxide (ITZO), or the like. For example, the first electrodes EL1-1, EL1-2, and EL1-3 may have a three-layer structure of ITO/Ag/ITO, but embodiments are not limited thereto. Further, the first electrodes EL1-1, EL1-2, and EL1-3 may include the above-described metal material, a combination of two or more metal materials selected from the above-described metal materials, or oxides of the above-described metal materials. A thickness of each of the first electrodes EL1-1, EL1-2, and EL1-3 may be about 700 Å to about 10000 Å. For example, the thickness of the first electrodes EL1-1, EL1-2, and EL1-3 may be about 1000 Å to about 3000 Å.

The hole transport region HTR may be provided on the first electrodes EL1-1, EL1-2, and EL1-3. The thickness of the hole transport region HTR may be, for example, about 50 Å to about 15,000 Å.

The hole transport region HTR may have a single layer formed using a single material, a single layer formed using multiple different materials, or a multilayer structure having multiple layers formed using multiple different materials. In an embodiment, the hole transport region HTR may include the first hole transport layer HTL1. The hole transport region HTR may further include the hole injection layer HIL. In the description, the same description for the hole transport region HTR may be adopted by the second hole transport layer HTL2 (FIG. 3) described above.

The hole transport region HTR may be formed by using various methods such as a vacuum deposition method, a spin coating method, a cast method, a Langmuir-Blodgett (LB) method, an inkjet printing method, a laser printing method, a laser induced thermal imaging (LITI) method, or a combination thereof.

The hole transport region HTR may include a phthalocyanine compound such as copper phthalocyanine, N1,N1'-([1,1'-biphenyl]-4,4'-diyl)bis(N1-phenyl-N4,N4-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N-di(naphthalene-1-yl)-N,N-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f:2',3'-h] quinoxaline-2,3,6,7,10,11-hexacarbonitrile (HATCN), or the like, or a combination thereof.

The hole transport region HTR may include a carbazole-based derivative such as N-phenyl carbazole and polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) and 4,4',4"-tris (N-carbazolyl)triphenylamine (TCTA), N,N'-di (naphthalene-1-yl)-N,N'-diphenyl-benzidine (NPB), 4,4'-cyclohexylidene bis[N,N-bis(4-methylphenyl) benzeneamine] (TAPC), 4,4'-bis[N,N'-(3-tolyl)amino]-3,3'-dimethylbiphenyl (HMTPD), 9-(4-tert-Butylphenyl)-3,6-bis (triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), or the like, or a combination thereof.

At least one of the hole injection layer HIL, the first hole transport layer HTL1, and the second hole transport layer HTL2 may include compounds of the hole transport region described above.

The thickness of the hole transport region HTR may be about 100 Å to about 10000 Å, for example, about 100 Å to about 5000 Å. If the hole transport region HTR includes the hole injection layer HIL, the thickness of the hole injection layer HIL may be, for example, about 30 Å to about 1000 Å. If the hole transport region HTR includes an electron blocking layer (not shown), a thickness of the electron blocking layer may be about 10 Å to about 1000 Å. If the thicknesses of the hole transport region HTR, the hole injection layer HIL, and the electron blocking layer satisfy the above-described ranges, satisfactory hole transport properties may be obtained without substantial increase of a driving voltage.

The hole transport region HTR may further include a charge generating material in addition to the above-described materials to improve conductivity. The charge generating material may be uniformly or non-uniformly dispersed in the hole transport region HTR. The charge generating material may be, for example, a p-dopant. The p-dopant may include at least one among halogenated metal compounds, quinone derivatives, metal oxides, and cyano group-containing compounds, but embodiments are not limited thereto. For example, the p-dopant may include a halogenated metal compound such as CuI and RbI, a quinone derivative such as tetracyanoquinodimethane (TCNQ) and 2,3,5,6-tetrafluoro-7,7',8,8'-tetracyanoquinodimethane (F4-TCNQ), metal oxide such as tungsten oxide and molybdenum oxide, a cyano group-containing compound such as dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile, or a combination thereof, but embodiments are not limited thereto.

The first blue emission layer EML1-1, the second emission layer EML2, and the third emission layer EML3 may be disposed above the hole transport region HTR. The second blue emission layer EML1-2 may be disposed above the second hole transport layer HTL2. The emission layers EML1-1, EML1-2, EML2, and EML3 each may have a thickness of, for example, about 100 Å to about 1000 Å or about 100 Å to about 300 Å. The emission layers EML1-1, EML1-2, EML2, and EML3 may have a single layer formed using a single material, a single layer formed using multiple different materials, or a multilayer structure having multiple layers formed using multiple different materials.

The emission layers EML1-1, EML1-2, EML2, and EML3 may include an anthracene derivative, a pyrene derivative, a fluoranthene derivative, a chrysene derivative, a dihydrobenzanthracene derivative, a triphenylene derivative, or a combination thereof. Specifically, the emission layers EML1-1, EML1-2, EML2, and EML3 may include an anthracene derivative or a pyrene derivative.

Each of the emission layers EML1-1, EML1-2, EML2, and EML3 may include a host and a dopant. The emission layers EML1-1, EML1-2, EML2, and EML3 may include a material such as a host material. For example, the emission layers EML1-1, EML1-2, EML2, and EML3 may include at least one among bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi) as the host material. However, embodiments are not limited thereto. For example, tris(8-hydroxyquinolino)aluminum (Alcp;), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO$_4$), 2,8-bis(diphenylphosphoryl)dibenzofuran (PPF), or the like, or a combination thereof may be used as the host material.

The emission layers EML1-1, EML1-2, EML2, and EML3 may include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi)), 4,4'-bis[2-(4-(N,N-diphenylamino)phenyl)vinyl]biphenyl (DPAVBi), perylene and a derivative thereof (for example, 2,5,8,11-tetra-t-butylperylene (TBP)), pyrene and a derivative thereof (for example, 1,1'-dipyrene, 1,4-dipyrenylbenzene,1,4-bis(N,N-diphenylamino)pyrene), or the like, or a combination thereof.

The emission layers EML1-1, EML1-2, EML2, and EML3 may include a phosphorescent dopant material. For example, a metal complex including iridium (Ir), platinum (Pt), osmium (Os), gold (Au), titanium (Ti), zirconium (Zr), hafnium (Hf), europium (Eu), terbium (Tb), thulium (Tm), or a combination thereof may be used as a phosphorescent dopant. Specifically, iridium(III) bis(4,6-difluorophenylpyridinato-N,C2 ')picolate (FIrpic), bis(2,4-difluorophenylpyridinato)-tetrakis(1-pyrazolyl)borate iridium(III) (FIr6), platinum octaethyl porphyrin (PtOEP), or a combination thereof may be used as a phosphorescent dopant. However, embodiments are not limited thereto.

The first blue emission layer EML1-1 and the second blue emission layer EML1-2 may emit blue light in a wavelength range of about 410 nm to about 480 nm. The second emission layer EML2 may emit green light in a wavelength range of about 500 nm to about 570 nm. The third emission layer EML3 may emit red light in a wavelength range of about 625 nm to about 675 nm.

The electron transport region ETR may be provided above the emission layers EML1-1, EML2, and EML3. The electron transport region ETR may include the first electron transport layer ETL1. The electron transport region ETR may further include the electron injection layer EIL. In the description, the same description for the electron transport region ETR may be adopted by the second electron transport layer ETL2.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, or a combination thereof.

The electron transport region ETR may include an anthracene-based compound. However, the embodiments are not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq$_2$),9,10-di(naphthalene-2-yl) anthracene (ADN),1,3-bis[3,5-di(pyridin-3-yl)phenyl] benzene (BmPyPhB), or a combination thereof.

The electron transport region ETR may include a halogenated metal such as LiF, NaCl, CsF, RbCl, RbI, CuI, KI, a lanthanide metal such as Yb, and a co-deposited material of the above-described halogenated metal and lanthanide metals as well. For example, the electron transport region ETR may include KI:Yb, RbI:Yb, or the like as a co-deposited material. The electron transport region ETR may include metal oxide such as Li$_2$O, BaO, or Liq(8-hydroxyl-lithium quinolate), but embodiments are not limited thereto. The electron transport region ETR may be also formed using a mixture material of an electron transport material and an insulating organo metal salt. The organo metal salt may be a material having an energy band gap of about 4 eV or more. Particularly, the organo metal salt may include, for example, metal acetates, metal benzoates, metal acetoacetates, metal acetylacetonates, or metal stearates.

The electron transport region ETR may further include, for example, at least one of 2,9-dimethyl-4,7-diphenyl-1,10-phenanthroline (BCP) and 4,7-diphenyl-1,10-phenanthroline (Bphen) in addition to the above-described materials, but embodiments are not limited thereto.

At least one of the first electron transport layer ETL1, the second electron transport layer ETL2, the electron injection layer EIL, and the buffer layer BFL may include a compound of the electron transport region described above.

If the electron transport region ETR includes the electron injection layer EIL, a thickness of the electron injection layer EIL may be about 1 Å to about 100 Å, for example, about 3 Å to about 90 Å. If the thicknesses of the electron injection layer EIL satisfies the above-described ranges, satisfactory electron injection properties may be obtained without substantial increase of a driving voltage.

A second electrode EL2 may be provided on the electron transport region ETR. The second electrode EL2 may be a common electrode. The second electrode EL2 may be a cathode or an anode, but embodiments are not limited thereto. For example, if the first electrodes EL1-1, EL1-2, and EL1-3 are anodes, the second electrode EL2 may be a cathode, and if the first electrodes EL1-1, EL1-2, and EL1-3 are cathodes, the second electrode EL2 may be an anode.

The second electrode EL2 may be a transmissive electrode, a transflective electrode, or a reflective electrode. If the second electrode EL2 is the transmissive electrode, the second electrode EL2 may include transparent metal oxide such as indium tin oxide (ITO), indium zinc oxide (IZO), zinc oxide (ZnO), indium tin zinc oxide (ITZO), or the like, or a combination thereof.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or a mixture thereof (for example, AgMg, AgYb, or MgAg). Alternatively, the second electrode EL2 may have a multilayered structure including a reflective film or a transflective film formed using the above-described materials and a transparent conductive film formed using indium tin oxide (ITO), indium zinc oxide (IZO), zinc oxide (ZnO), indium tin zinc oxide (ITZO), or the like, or a combination thereof. For example, the second electrode EL2 may include the above-described metal material, a combination of two or more metal materials selected from the above-described metal materials, or an oxide of the above-described metal materials.

Although not illustrated, the second electrode EL2 may be connected to an auxiliary electrode. If the second electrode EL2 is connected to the auxiliary electrode, the resistance of the second electrode EL2 may decrease.

A light-emitting element ETD according to an embodiment may include a capping layer CPL disposed above the second electrode EL2. The capping layer CPL may include multiple layers or a single layer.

In an embodiment, the capping layer CPL may be an organic layer or an inorganic layer. For example, if the capping layer CPL includes an inorganic material, the inorganic material may include an alkali metal compound such as LiF, an alkaline earth metal compound such as MgF$_2$, SiON, SiNx, SiOy, or the like, or a combination thereof.

For example, if the capping layer CPL includes an organic material, the organic material may include α-NPD, NPB, TPD, m-MTDATA, Alq$_3$, CuPc, N4,N4,N4',N4'-tetra (biphenyl-4-yl) biphenyl-4,4'-diamine (TPD15), 4,4',4''-tris (carbazol-9-yl) triphenylamine (TCTA), etc., epoxy resins, or acrylate such as methacrylate, or a combination thereof. However, embodiments are not limited thereto, and the capping layer CPL may include at least one among Compounds P1 to P5 below.

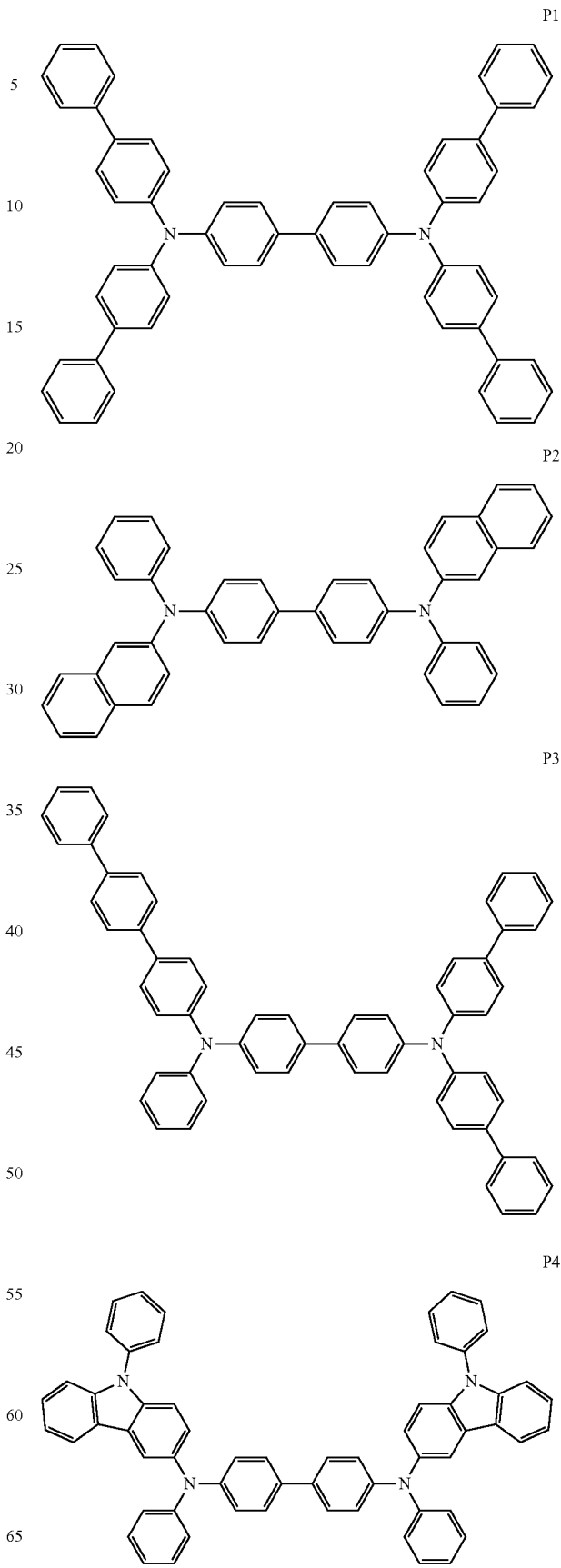

-continued

P5

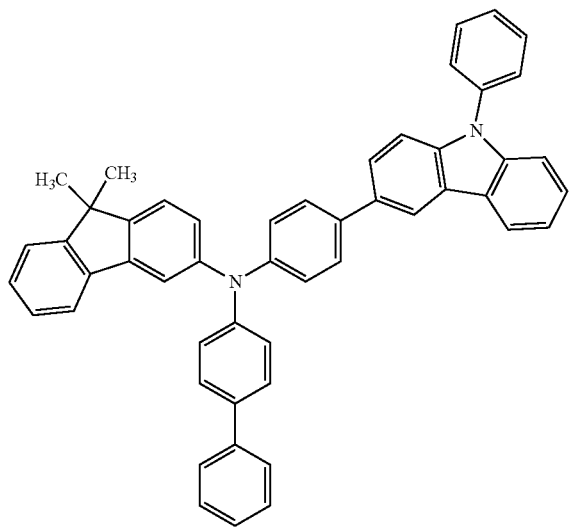

According to an embodiment, the refractive index of the capping layer CPL may be about 1.6 or more. Specifically, for light having the wavelength range of about 550 nm to about 660 nm, the refractive index of the capping layer CPL may be about 1.6 or more.

In FIG. 2, the light-emitting parts ED-1, ED-2, and ED-3 may be disposed in an opening OH defined in the pixel-defining film PDL, and the hole transport region HTR, the electron transport region ETR, and the second electrode EL2 may be provided as common layers. However, embodiments are not limited thereto. Unlike the configuration illustrated in FIG. 2, in an embodiment the hole transport region HTR and the electron transport region ETR may be patterned and provided in the opening OH defined in the pixel-defining film PDL. For example, the hole transport region HTR, the emission layers EML1-1, EML1-2, EML2, and EML3, and the electron transport region ETR, etc. may be patterned and provided by an inkjet printing method.

An encapsulating layer TFE may seal the light-emitting element ETD. The encapsulating layer TFE may be a thin film encapsulating layer. The encapsulating layer TFE may be a single layer or multiple layers being stacked. The encapsulating layer TFE may include at least one insulating layer. The encapsulating layer TFE according to an embodiment may include at least one inorganic film (hereinafter, an encapsulating inorganic film) The encapsulating layer TFE according to an embodiment may include at least one organic film (hereinafter, an encapsulating organic film) and at least one encapsulating inorganic film.

The encapsulating inorganic film may protect the light-emitting element ETD from moisture/oxygen, and the encapsulating organic film may protect the light-emitting element ETD from foreign materials such as dust particles. The encapsulating inorganic film may include silicon nitride, silicon oxy nitride, silicon oxide, titanium oxide, aluminum oxide, or the like, or a combination thereof, but embodiments are not particularly limited thereto. The encapsulating organic film may include an acrylic-based compound, an epoxy-based compound, or the like, or a combination thereof. The encapsulating organic film may include a photopolymerizable organic material, but embodiments are not particularly limited thereto.

The encapsulating layer TFE may be disposed above the second electrode EL2 and may be disposed while filling the opening OH.

Figure 7:
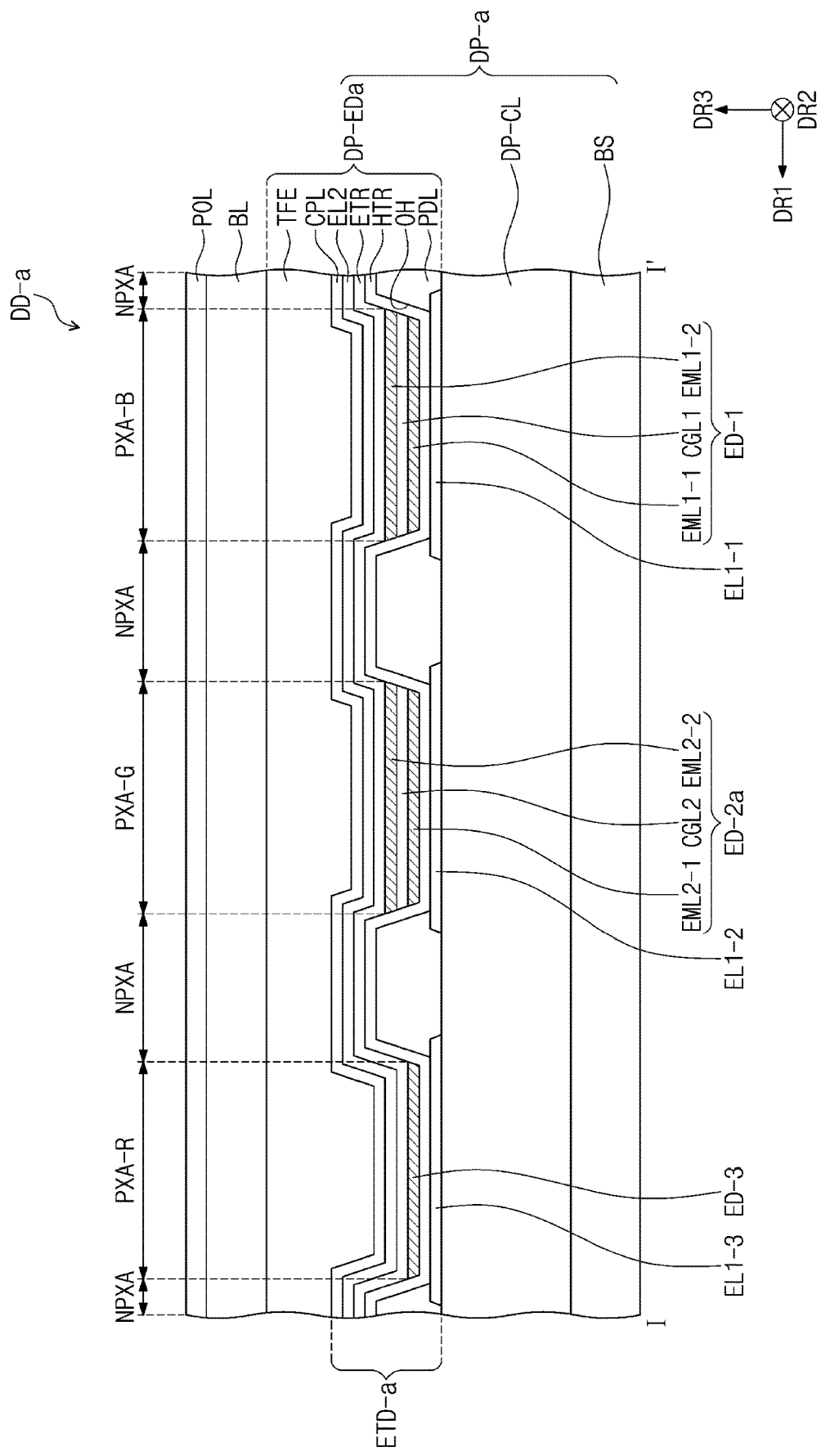
FIG. 7 is a cross-sectional view schematically illustrating a display device according to an embodiment.
Figure 8:
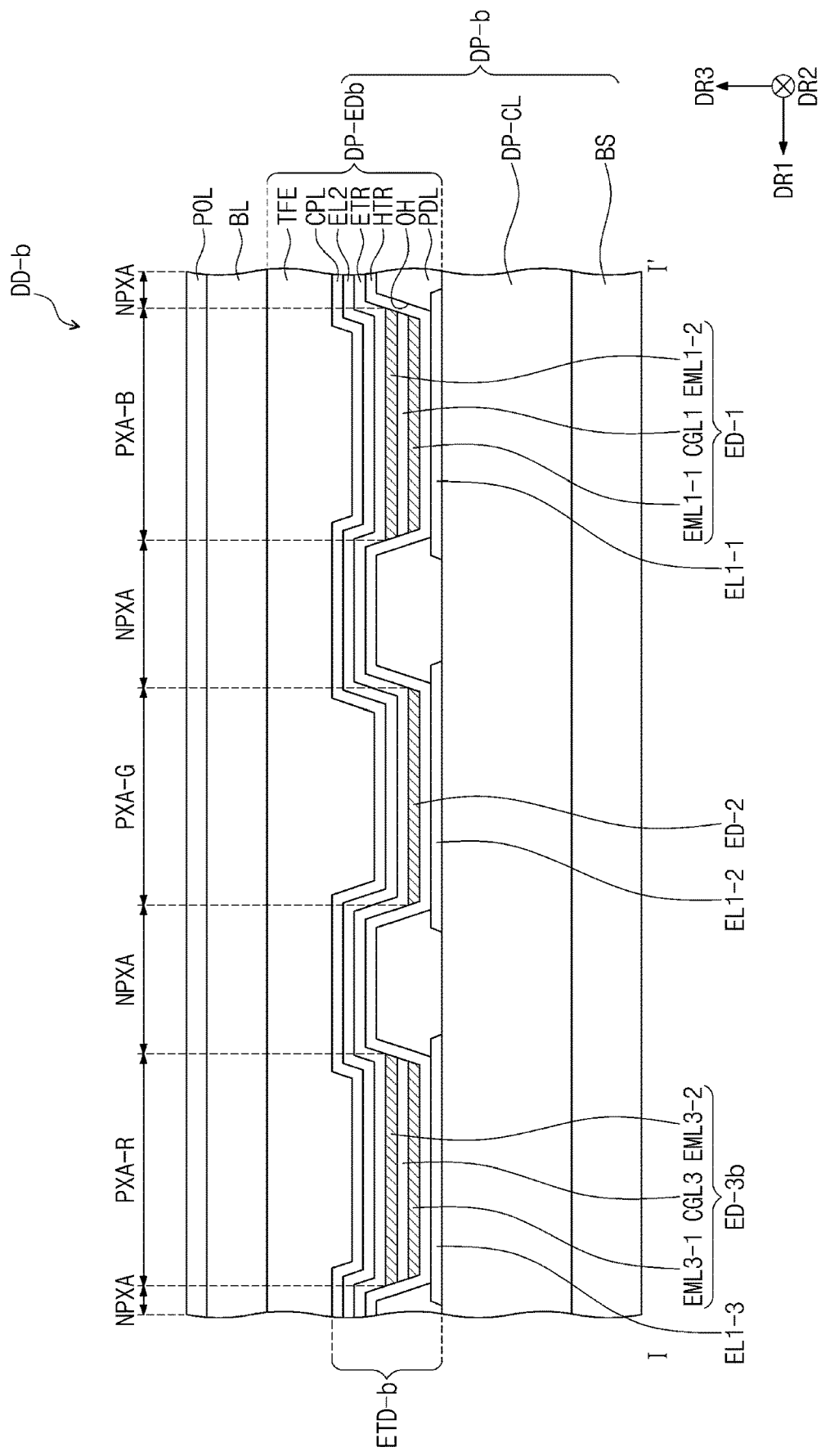
FIG. 8 is a cross-sectional view schematically illustrating a display device according to an embodiment.

FIGS. 7 and 8 are cross-sectional views schematically illustrating another embodiment, illustrating a portion taken along line I-I' in FIG. 1. Unlike FIG. 2, FIGS. 7 and 8 illustrate a case where a second light-emitting part ED-2a or a third light-emitting part ED-3b may include multiple emission layers. Hereinafter, components described with reference to FIGS. 1 to 6 are denoted by the same reference numerals, and detailed descriptions may be omitted.

Display devices DD-a and DD-b may include display panels DP-a and DP-b. The display panels DP-a and DP-b may include display element layers DP-EDa and DP-EDb, and the display element layers DP-EDa and DP-EDb may include light-emitting elements ETD-a and ETD-b according to an embodiment. The light-emitting elements ETD-a and ETD-b according to an embodiment may include first electrodes EL1-1, EL1-2, and EL1-3, a hole transport region HTR, an electron transport region ETR, and a second electrode EL2 which may be sequentially stacked. The light-emitting elements ETD-a and ETD-b according to an embodiment may include a first light-emitting part ED-1, second light-emitting parts ED-2 and ED-2a, and third light-emitting parts ED-3 and ED-3b which may be disposed between the hole transport region HTR and the electron transport region ETR.

The second light-emitting part ED-2a may include a first green emission layer EML2-1, a second green emission layer EML2-2 disposed above the first green emission layer EML2-1, and a second charge generation layer CGL2 disposed between the first green emission layer EML2-1 and the second green emission layer EML2-2. The first green emission layer EML2-1 may be disposed above the hole transport region HTR. The second green emission layer EML2-2 may be disposed below the electron transport region ETR. The first green emission layer EML2-1 and the second green emission layer EML2-2 may emit green light of the same wavelength region. The same description for the second emission layer EML2 may be adopted by the first green emission layer EML2-1 and the second green emission layer EML2-2. The same description for the first charge generation layer CGL1 may be adopted by the second charge generation layer CGL2.

The third light-emitting part ED-3b may include a first red emission layer EML3-1, a second red emission layer EML3-2 disposed above the first red emission layer EML3-1, and a third charge generation layer CGL3 disposed between the first red emission layer EML3-1 and the second red emission layer EML3-2. The first red emission layer EML3-1 may be disposed above the hole transport region HTR. The second red emission layer EML3-2 may be disposed below the electron transport region ETR. The first red emission layer EML3-1 and the second red emission layer EML3-2 may emit light of the same wavelength region. The same description for the third emission layer EML3 may be adopted by the first red emission layer EML3-1 and the second red emission layer EML3-2. The same description for the first charge generation layer CGL1 may be adopted by the third charge generation layer CGL3.

Although not shown, the second light-emitting part ED-2a may further include the electron transport layer disposed between the first green emission layer EML2-1 and the second charge generation layer CGL2, and the hole transport layer disposed between the second charge generation layer CGL2 and the second green emission layer EML2-2. The third light-emitting part ED-3b may further include the electron transport layer disposed between the first red emission layer EML3-1 and the third charge generation layer CGL3, and the hole transport layer disposed between the third charge generation layer CGL3 and the second red emission layer EML3-2.

Figure 9A:
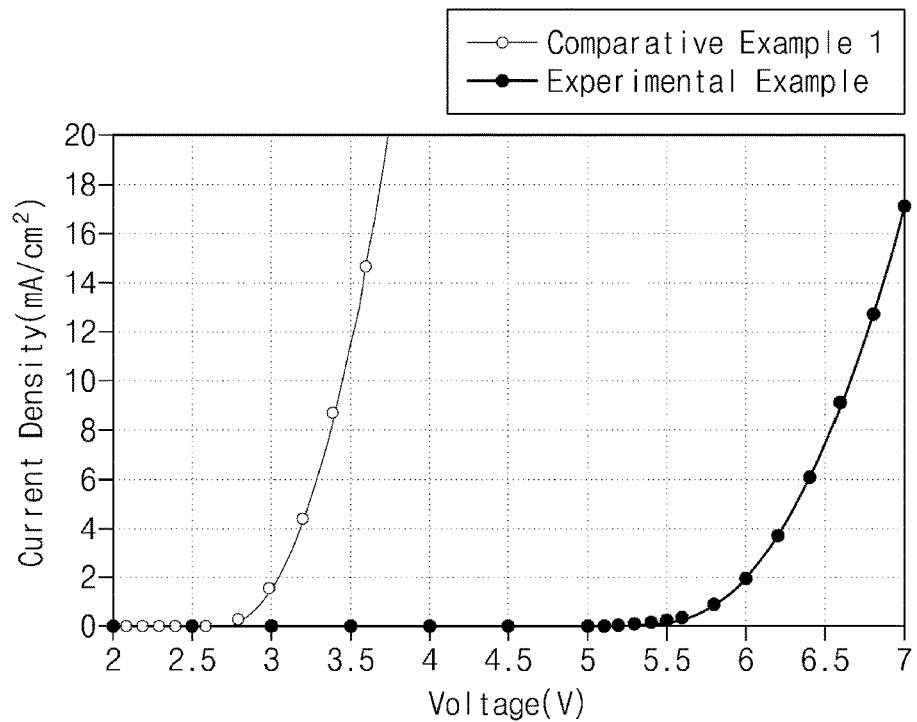
FIG. 9A is a graph schematically showing the current density according to the voltage in a Comparative Example and Experimental Example.
Figure 9B:
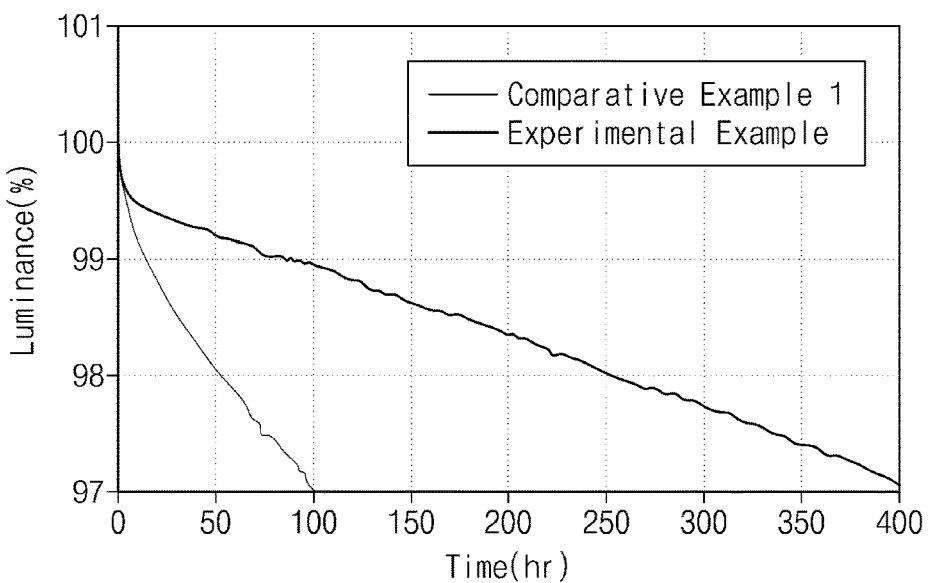
FIG. 9B is a graph schematically showing changes in luminance over time in a Comparative Example and Experimental Example.

FIG. 9A is a graph schematically showing the current density according to driving voltage in the light-emitting elements according to Comparative Example 1 and Experimental Example. FIG. 9B is a graph schematically showing the measurement of the time taken to decrease the luminance of the light-emitting element to about 97% in the light-emitting elements of Comparative Example 1 and Experimental Example. The light-emitting element according to Experimental Example includes the first light-emitting part according to an embodiment, and more specifically may be a blue light-emitting element including a first blue emission layer and a second blue emission layer. Comparative Example 1 may be a blue light-emitting element including one blue emission layer.

Referring to FIG. 9A, it may be seen that a driving voltage of the light-emitting element according to Experimental Example increased by about 1.7 to about 1.9 times in a current density range of about 10 mA/cm$^2$ to about 15 mA/cm$^2$ compared with that of the light-emitting element according to Comparative Example 1. Referring to FIG. 9B, it may be seen that the time taken to decrease luminance of the light-emitting element of Experimental Example to 97% may be about 4 times that of Comparative Example 1. It was confirmed that efficiency in the light-emitting element according to an embodiment was improved by about 135%, through simulation by comparing the light-emitting element according to an embodiment including one red emission layer, one green emission layer, and two blue emission layers, with the light-emitting element having each one of red emission layers, green emission layers, and blue emission layers.

Table 1 below shows the measurements of external quantum efficiency (EQE) of the light-emitting elements according to Comparative Example 1 and Experimental Example, and "efficiency" may be the external quantum efficiency divided by color coordinates. The external quantum efficiency of the light-emitting element according to Comparative Example 1 was measured under the condition of a current density of about 11.0 mA/cm$^2$ and a current efficiency of about 10.0 cd/A. The external quantum efficiency of the light-emitting element according to Experimental Example was measured under the condition of a current density of about 6.2 mA/cm$^2$ and a current efficiency of about 14.3 cd/A.

TABLE 1

| Number | current density (mA/cm$^2$) | current efficiency (cd/A) | efficiency | color coordinates (CIE, y) |
|---|---|---|---|---|
| Comparative Example 1 | 11.0 | 10.0 | 196.4 | 0.051 |
| Experimental Example | 6.2 | 14.3 | 348.2 | 0.041 |

Referring to table 1, it may be seen that efficiency of the light-emitting element according to Experimental Example may be better than that of the light-emitting element according to Comparative Example 1. Accordingly, it may be determined that the light-emitting element according to an embodiment including multiple emission layers configured to emit light of the same wavelength region will exhibit improved efficiency.

Figure 10A:
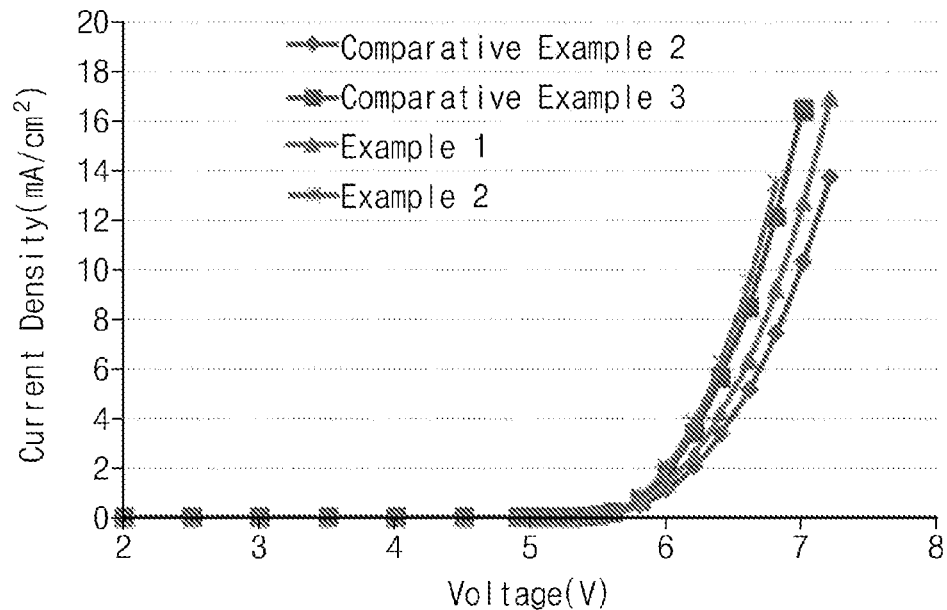
FIG. 10A is a graph schematically showing the current density according to the voltage in Comparative Examples and Examples.
Figure 10B:
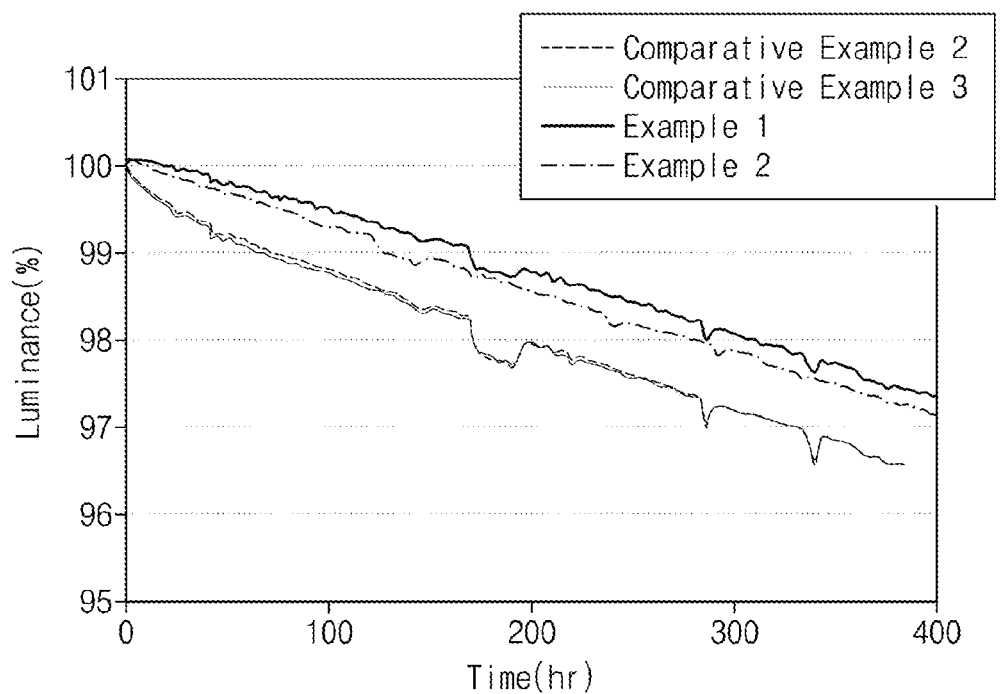
FIG. 10B is a graph schematically showing changes in luminance over time in Comparative Examples and Experimental Examples.

FIG. 10A is a graph schematically showing measurements of current density according to the driving voltage in the light-emitting elements according to Comparative Examples 2 and 3, and Examples 1 and 2. FIG. 10B is a graph schematically showing the measurements of the time taken to decrease the luminance of the light-emitting elements to about 97% in the light-emitting elements according to Comparative Examples 2 and 3, and Examples 1 and 2. Comparative Examples 2 and 3, and Examples 1 and 2 may be light-emitting elements including two blue emission layers, one green emission layer, and one red emission layer.

Comparative Examples 2 and 3 may be light-emitting elements that include buffer layers directly disposed on the blue emission layers, and that may have a structure further including the buffer layer disposed between the second electron transport layer and the first blue emission layer, in the structure illustrated in FIG. 4. The second electron transport layer may include multiple different materials in the light-emitting element according to Comparative Example 2, the second electron transport layer may include a single material in the light-emitting element according to Comparative Example 3, and the first electron transport layer includes a single material in the light-emitting elements according to Comparative Examples 2 and 3.

Examples 1 and 2 may be the light-emitting elements that have the same structure as the structure illustrated in FIG. 3, and may not include buffer layers. For example, Examples 1 and 2 may be the light-emitting elements in which the first electron transport layer ETL1 may be directly disposed on the second blue emission layer EML1-2, and the second electron transport layer ETL2 may be directly disposed on the first blue emission layer EML1-1. The first electron transport layer ETL1 according to Example 1 may include multiple different materials, and the first electron transport layer ETL1 according to Example 2 may include a single material. In the light-emitting elements according to Examples 1 and 2, the first electron transport layer ETL1 may include a single material.

Referring to FIG. 10A, it may be seen that the light-emitting elements according to Examples 1 and 2 exhibit similar level of the driving voltage at the same current density compared to the light-emitting elements according to Comparative Example 2 and Comparative Example 3. Referring to FIG. 10B, it may be seen that the light-emitting elements according to Examples 1 and 2 take more time to decrease the luminance in case that the amount of decrease in luminance is the same, compared to the light-emitting elements according to Comparative Examples 2 and 3. It may be seen that the light-emitting elements according to Examples 1 and 2 take 1.27 to 1.36 times more time than the light-emitting elements according to Comparative Examples 2 and 3, when the luminance of the light-emitting element decrease to about 97% to about 98%. Accordingly, it may be determined that the light-emitting element according to an embodiment including at least one electron transport layer directly disposed on the emission layer will exhibit improved life span.

Table 2 below shows the measurements of external quantum efficiency of the light-emitting elements according to Comparative Examples 2 and 3 and Examples 1 and 2, and "efficiency" may be the external quantum efficiency divided by color coordinates. The external quantum efficiency of the light-emitting element according to Comparative Example 2 was measured under the condition of a driving voltage of about 6.7 V and a current efficiency of about 16.1 cd/A. The external quantum efficiency of the light-emitting element according to Comparative Example 3 was measured under the condition of a driving voltage of about 6.5 V and a current efficiency of about 16.4 cd/A. The external quantum efficiency of the light-emitting element according to Example 1 was measured under the condition of a driving voltage of about 6.6 V and a current efficiency of about 14.6 cd/A. The external quantum efficiency of the light-emitting element according to Example 2 was measured under the condition of a driving voltage of about 6.4 V and a current efficiency of about 14.1 cd/A.

TABLE 2

| Number | driving voltage (V) | current efficiency (cd/A) | efficiency | color coordinates (CIE, y) |
| --- | --- | --- | --- | --- |
| Comparative Example 2 | 6.7 | 16.1 | 324.3 | 0.0050 |
| Comparative Example 3 | 6.5 | 16.4 | 331.8 | 0.0053 |
| Example 1 | 6.6 | 14.6 | 318.8 | 0.046 |
| Example 2 | 6.4 | 14.1 | 329.8 | 0.043 |

Referring to Table 2, it may be seen that when the light-emitting elements according to Comparative Examples 2 and 3 in which the buffer layer may be disposed between the electron transport layer and the emission layer, and the light-emitting elements according to Examples 1 and 2 in which the electron transport layer may be directly disposed on the emission layer are compared, they exhibit a similar level of efficiency. It may be seen that the light-emitting element according to Example 1 exhibits a similar level of efficiency compared to the light-emitting element according to Comparative Example 2. In the light-emitting element according to Comparative Example 2 and the light-emitting element according to Example 1, the second electron transport layer may include multiple different materials.

It may be seen that the light-emitting element according to Example 2 exhibits a similar level of efficiency compared to the light-emitting element according to Comparative Example 3. In the light-emitting element according to Comparative Example 3 and the light-emitting element according to Example 2, the second electron transport layer includes a single material. Given that the light-emitting element according to Example 2 in which the electron transport layer may be directly disposed on the emission layer exhibits a similar level of efficiency with the light-emitting element according to Comparative Example 3 in which the buffer layer may be disposed between the electron transport layer and the emission layer, it may be seen that the electron transport layer including a single material may contribute to preventing holes from leaving the emission layer, and injecting holes to the emission layer.

The light-emitting element according to an embodiment may include a first electrode, a hole transport region, an electron transport region, and a second electrode which may be sequentially stacked, and may include light-emitting parts disposed between the hole transport region and the electron transport region. The light-emitting parts may each include one or more emission layers, and the electron transport layer may be directly disposed on the emission layer in at least one light-emitting part. At least one of the two or more electron transport layers may be directly disposed on the emission layer. Accordingly, a light-emitting element according to an embodiment may exhibit long life span properties.

The emission layers may be spaced apart from the first electrode by a distance in the light-emitting element according to an embodiment. The emission layers and the first electrode may be spaced apart by a second resonance distance and/or a third resonance distance of light emitted from the emission layers. Accordingly, the light-emitting element according to an embodiment may exhibit improved efficiency.

The display device according to an embodiment may include a base layer and a display element layer disposed on the base layer, and the display element layer may include the light-emitting element according to an embodiment. The light-emitting element may include two electron transport layers and two emission layers, and at least one electron transport layer may be directly disposed on the emission layers. Accordingly, a display device including a light-emitting element according to an embodiment may exhibit improved efficiency and life span.

A light-emitting element according to an embodiment may include an electron transport layer directly disposed on an emission layer, thereby exhibiting long life span properties.

An embodiment provides a light-emitting element in which number of red emission layers, number of green emission layers, and number of blue emission layers may be different from each other, and the light-emitting element according to an embodiment may exhibit improved efficiency due to the different numbers of emission layers.

The display device according to an embodiment may include multiple emission layers and a light-emitting element in which an electron transport layer directly disposed on the emission layers may be disposed, thereby exhibiting excellent efficiency and long life span properties.

Although the embodiments have been described herein, it is understood that various changes and modifications can be made by those skilled in the art within the spirit and scope of the disclosure defined by the following claims or equivalents. Therefore, the technical scope of the disclosure should not be limited to the content described in the detailed description of the specification, but should be determined by the claims including equivalents thereof.

What is claimed is:

1. A light-emitting element comprising:
a first electrode;
a second electrode facing the first electrode;
a first hole transport layer disposed above the first electrode;
a first electron transport layer disposed between the first hole transport layer and the second electrode; and
a first light-emitting part and a second light-emitting part which are disposed between the first hole transport layer and the first electron transport layer, the first light-emitting part and the second light-emitting part being spaced apart from each other, wherein
the first light-emitting part comprises:
a first blue emission layer disposed above the first hole transport layer;
a second blue emission layer disposed above the first blue emission layer;
a charge generation layer disposed between the first blue emission layer and the second blue emission layer; and
a second electron transport layer disposed between the first blue emission layer and the charge generation layer, wherein
the second light-emitting part is a single emission layer structure of a second emission layer that emits red light or green light such that only one emission layer structure of the second emission layer is disposed between the first electrode and the second electrode, at least one of the first electron transport layer and the second electron transport layer is directly disposed above at least one of the first blue emission layer and the second blue emission layer, and a material included in the first electron transport layer and a material included in the second electron transport layer are different from each other with one of the first electron transport layer and the second electron transport layer including an electron transport material and an n-dopant.

2. The light-emitting element of claim 1, wherein the second electron transport layer is directly disposed above the first blue emission layer.

3. The light-emitting element of claim 2, further comprising a buffer layer directly disposed between the first electron transport layer and the second blue emission layer.

4. The light-emitting element of claim 3, wherein a thickness of the buffer layer is about 100 Å or less.

5. The light-emitting element of claim 1, wherein the first electron transport layer is directly disposed above the second emission layer.

6. The light-emitting element of claim 1, wherein at least one of the first electron transport layer and the second electron transport layer has a thickness of about 100 Å to about 300 Å.

7. The light-emitting element of claim 1, further comprising a third light-emitting part including a third emission layer that emits red light or green light, wherein the third emission layer and the second emission layer emit light of different wavelength regions.

8. The light-emitting element of claim 1, wherein each of the first blue emission layer and the second blue emission layer comprises a dopant and a host, and the dopant of the first blue emission layer and the dopant of the second blue emission layer are different from each other.

9. The light-emitting element of claim 8, wherein the host of the first blue emission layer and the host of the second blue emission layer are different from each other.

10. The light-emitting element of claim 8, wherein a content of the dopant in the first blue emission layer and a content of the dopant in the second blue emission layer are different from each other.

11. The light-emitting element of claim 1, further comprising:

a first blue light-emitting auxiliary layer disposed below the first blue emission layer;

a second blue light-emitting auxiliary layer disposed below the second blue emission layer; and a second light-emitting auxiliary layer disposed below the second emission layer.

12. The light-emitting element of claim 1, further comprising a hole injection layer disposed above the first electrode.

13. The light-emitting element of claim 1, further comprising an electron injection layer disposed below the second electrode.

14. The light-emitting element of claim 1, further comprising a capping layer disposed above the second electrode and having a refractive index of about 1.6 or more.

15. A light-emitting element comprising:

a first electrode;

a second electrode facing the first electrode;

a first hole transport layer disposed above the first electrode;

a first electron transport layer disposed between the first hole transport layer and the second electrode; and a first light-emitting part and a second light-emitting part which are spaced apart from each other and disposed between the first hole transport layer and the first electron transport layer, the first light-emitting part emitting first light and the second light-emitting part emitting second light that is different from the first light, wherein the first light-emitting part comprises:

a first blue emission layer disposed above the first hole transport layer;

a second blue emission layer disposed above the first blue emission layer;

a charge generation layer disposed between the first blue emission layer and the second blue emission layer; and a second electron transport layer disposed between the first blue emission layer and the charge generation layer, wherein the second light-emitting part is a single emission layer structure of a second emission layer that emits the second light such that only one emission layer structure of the second emission layer is disposed between the first electrode and the second electrode, a straight-line distance from the first electrode to the first blue emission layer is equal to a second resonance distance of the first light, a straight-line distance from the first electrode to the second emission layer is equal to a second resonance distance of the second light, a straight-line distance from the first electrode to the second blue emission layer is equal to a third resonance distance of the first light, and a material included in the first electron transport layer and a material included in the second electron transport layer are different from each other with one of the first electron transport layer and the second electron transport layer including an electron transport material and an n-dopant.

16. The light-emitting element of claim 15, wherein at least one of the first electron transport layer and the second electron transport layer is directly disposed above at least one of the first blue emission layer and the second blue emission layer.

17. The light-emitting element of claim 15, wherein the second light is red light or green light.

18. The light-emitting element of claim 15, further comprising a third light-emitting part including a third emission layer that emits a third light that is different from the first light and the second light, wherein the straight-line distance from the first electrode to the third emission layer is equal to a second resonance distance of the third light.

19. A display device comprising:

a blue light-emitting region, a red light-emitting region, and a green light-emitting region which are spaced apart from each other;

a base layer;

a display element layer disposed on the base layer and including a light-emitting element, wherein the light-emitting element comprises:

a first electrode;

a second electrode facing the first electrode;

a first hole transport layer disposed above the first electrode;

a first electron transport layer disposed between the first hole transport layer and the second electrode;

a first light-emitting part and a second light-emitting part disposed between the first hole transport layer and the first electron transport layer, and spaced apart from each other; and a capping layer disposed above the second electrode and having a refractive index of about 1.6 or more, the first light-emitting part comprises:

a first blue emission layer disposed above the first hole transport layer;

a second blue emission layer disposed above the first blue emission layer;

a charge generation layer disposed between the first blue emission layer and the second blue emission layer; and a second electron transport layer disposed between the first blue emission layer and the charge generation layer, wherein the second light-emitting part is a single emission layer structure of a second emission layer that emits red light or green light such that only one emission layer structure of the second emission layer is disposed between the first electrode and the second electrode, at least one of the first electron transport layer and the second electron transport layer is directly disposed above at least one of the first blue emission layer and the second blue emission layer, and one of the first electron transport layer and the second electron transport layer includes electron transport material and an n-dopant.

20. The light-emitting element of claim 1, wherein the content of the n-dopant is about 50% or less, and the n-dopant is one of Li, $Cs_2CO_3$, and $Rb_2CO_3$.

21. The light-emitting element of claim 1, further comprising:

a first blue light-emitting auxiliary layer disposed below the first blue emission layer, and a second blue light-emitting auxiliary layer disposed below the second blue emission layer, wherein each of the first blue light-emitting auxiliary layer and the second blue light-emitting auxiliary layer control a balance of hole charges so as to increase blue light-emitting efficiency.

* * * * *